United States Patent
Kumagai et al.

(10) Patent No.: US 11,996,296 B2
(45) Date of Patent: May 28, 2024

(54) SUBSTRATE PROCESSING METHOD AND SUBSTRATE PROCESSING SYSTEM

(71) Applicant: Tokyo Electron Limited, Tokyo (JP)

(72) Inventors: Kae Kumagai, Miyagi (JP); Ryutaro Suda, Miyagi (JP); Maju Tomura, Miyagi (JP); Kenji Ouchi, Yamanashi (JP); Hiroki Murakami, Yamanashi (JP); Munehito Kagaya, Yamanashi (JP); Shuichiro Sakai, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 115 days.

(21) Appl. No.: 17/528,196

(22) Filed: Nov. 17, 2021

(65) Prior Publication Data

US 2022/0157616 A1    May 19, 2022

(30) Foreign Application Priority Data

Nov. 17, 2020  (JP) ................................. 2020-190713

(51) Int. Cl.
*H01L 21/311* (2006.01)
*H01J 37/32* (2006.01)

(52) U.S. Cl.
CPC .. *H01L 21/31116* (2013.01); *H01J 37/32449* (2013.01); *H01J 2237/3341* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 2016/0035742 A1* | 2/2016 | Kanakamedala | H10B 43/35 438/264 |
| 2016/0343580 A1 | 11/2016 | Hudson | |
| 2017/0250068 A1* | 8/2017 | Ishikawa | H01L 21/02274 |
| 2018/0174858 A1 | 6/2018 | Hudson | |

* cited by examiner

*Primary Examiner* — Roberts P Culbert
(74) *Attorney, Agent, or Firm* — XSENSUS LLP

(57) ABSTRACT

A substrate processing method includes: (a) carrying a substrate having a first film with a recess, and a mask into a first chamber; (b) adjusting the substrate temperature to 200° C. or higher; (c-1) supplying silicon-containing reactive species into the first chamber, thereby adsorbing the species onto the side wall of the recess; and (c-2) supplying nitrogen-containing reactive species into the first chamber, thereby forming a second film on the side wall of the recess; (d) carrying the substrate into a second chamber; and (e) adjusting the substrate temperature to 100° C. or lower; and (f) etching the bottom of the recess. Further, (a) to (f) are repeated in this order until an aspect ratio of a depth dimension from the opening of the mask to the bottom of the recess becomes 50 or more.

16 Claims, 23 Drawing Sheets

FIG. 3A
FIG. 3B
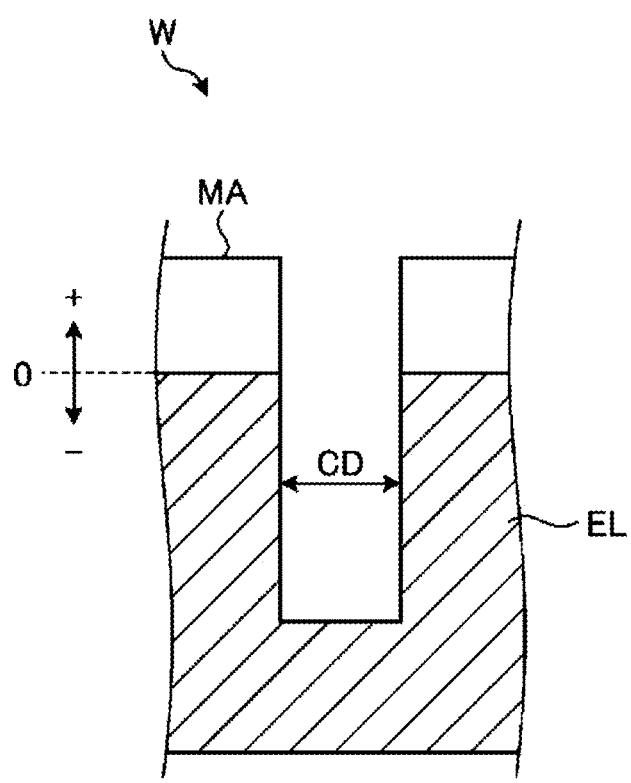
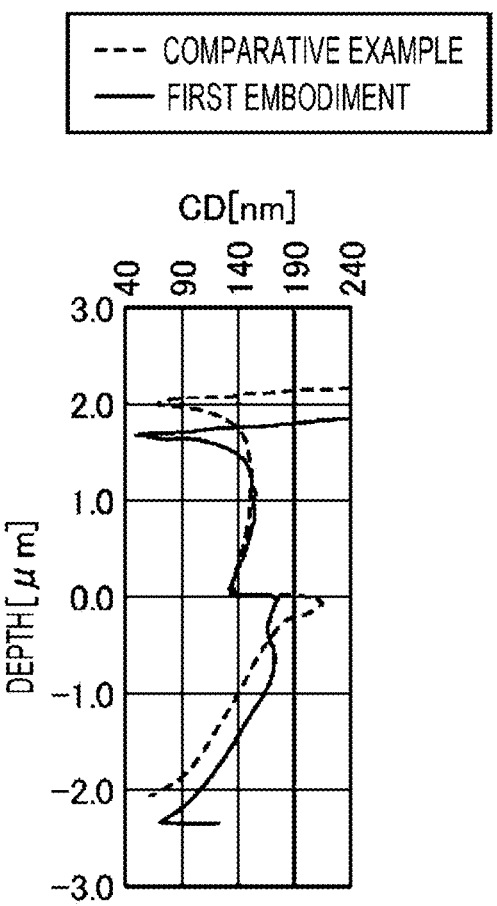

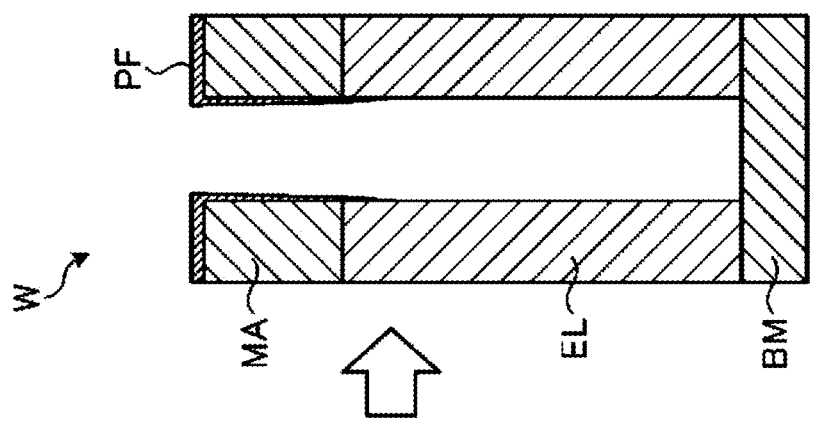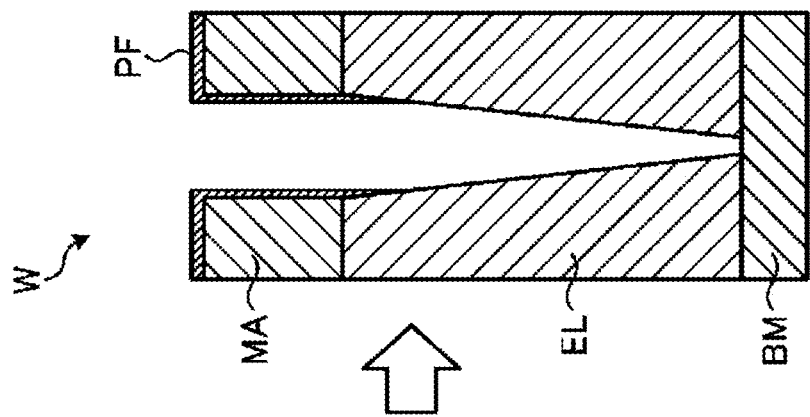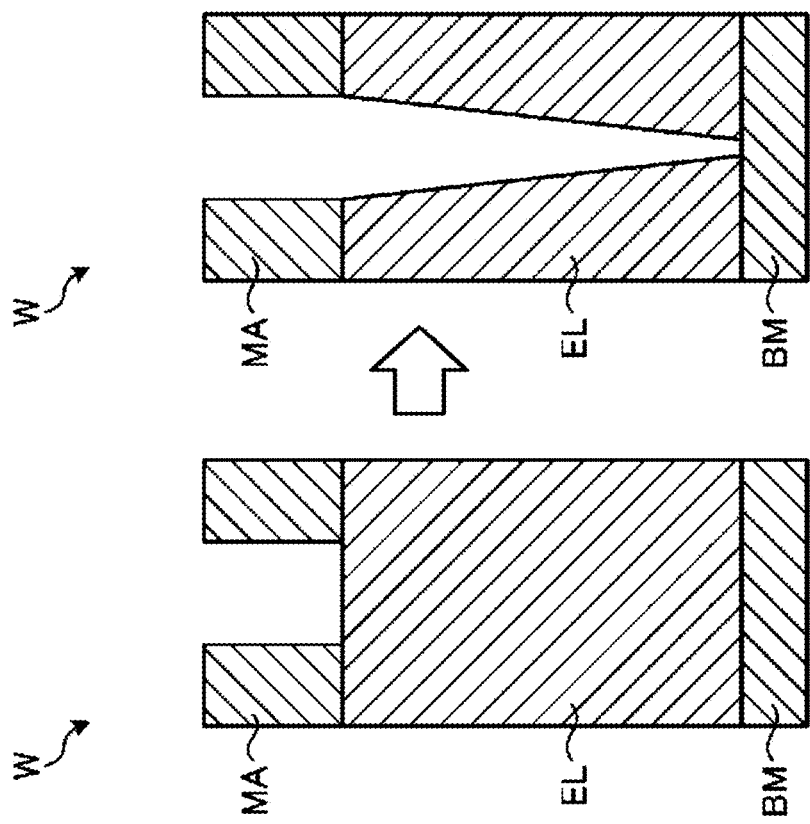

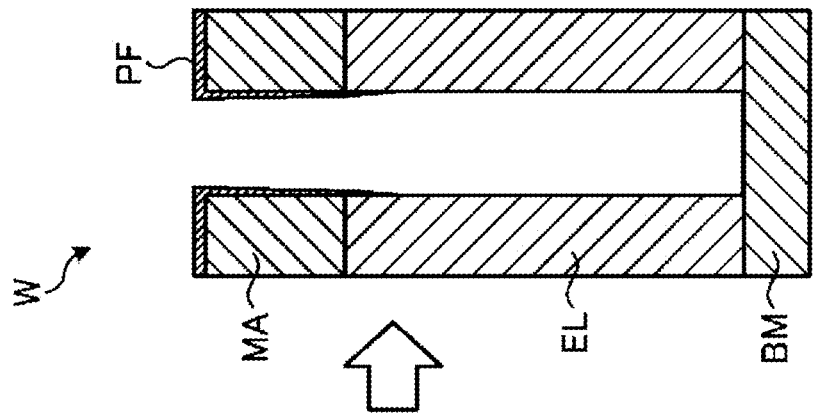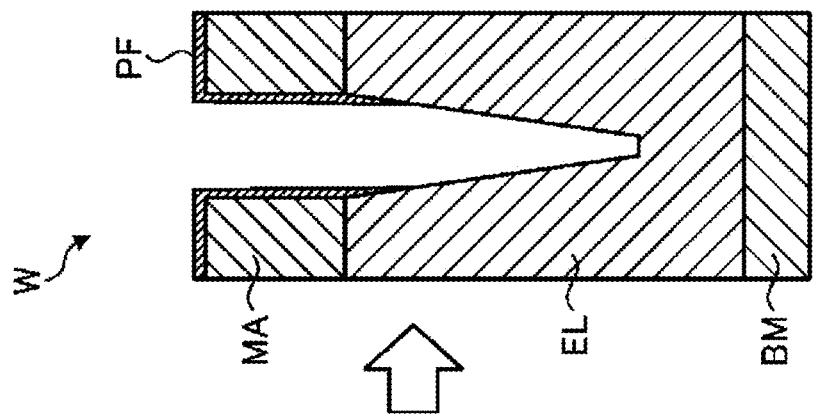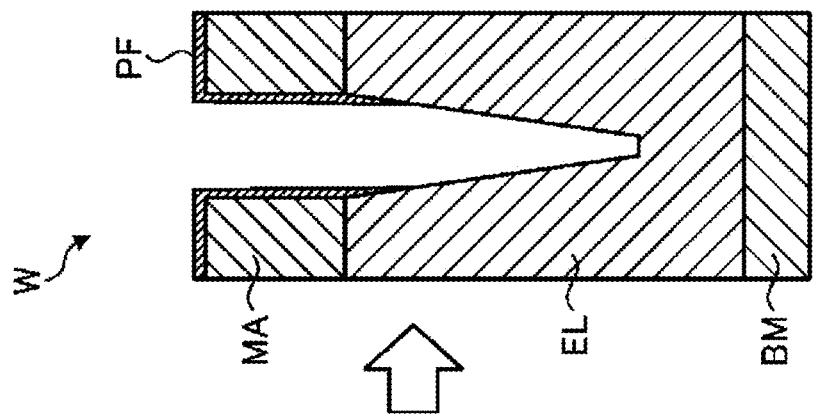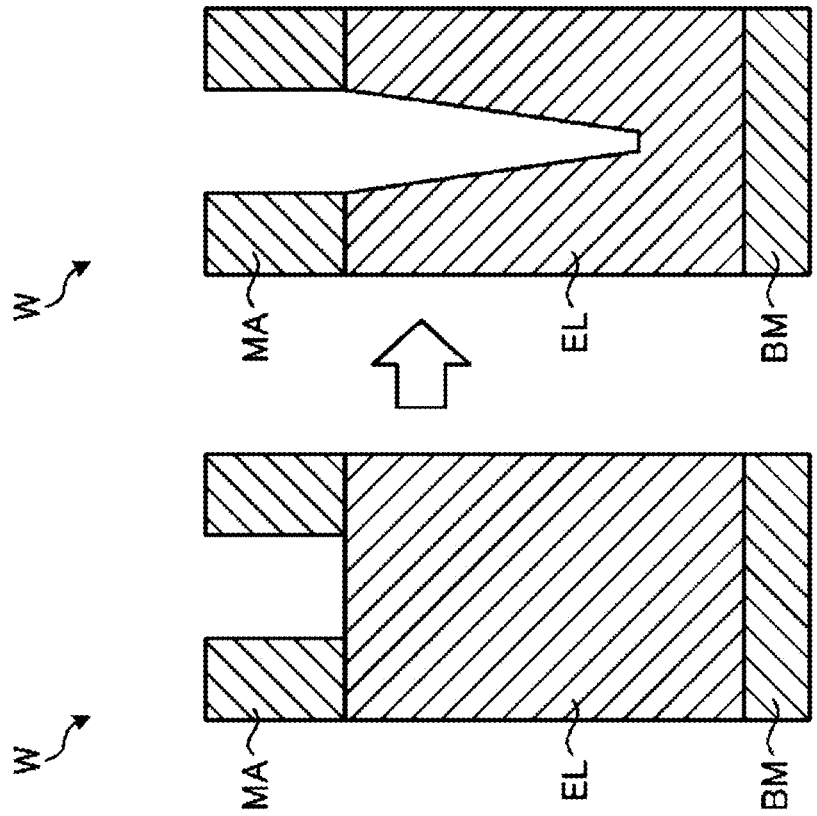

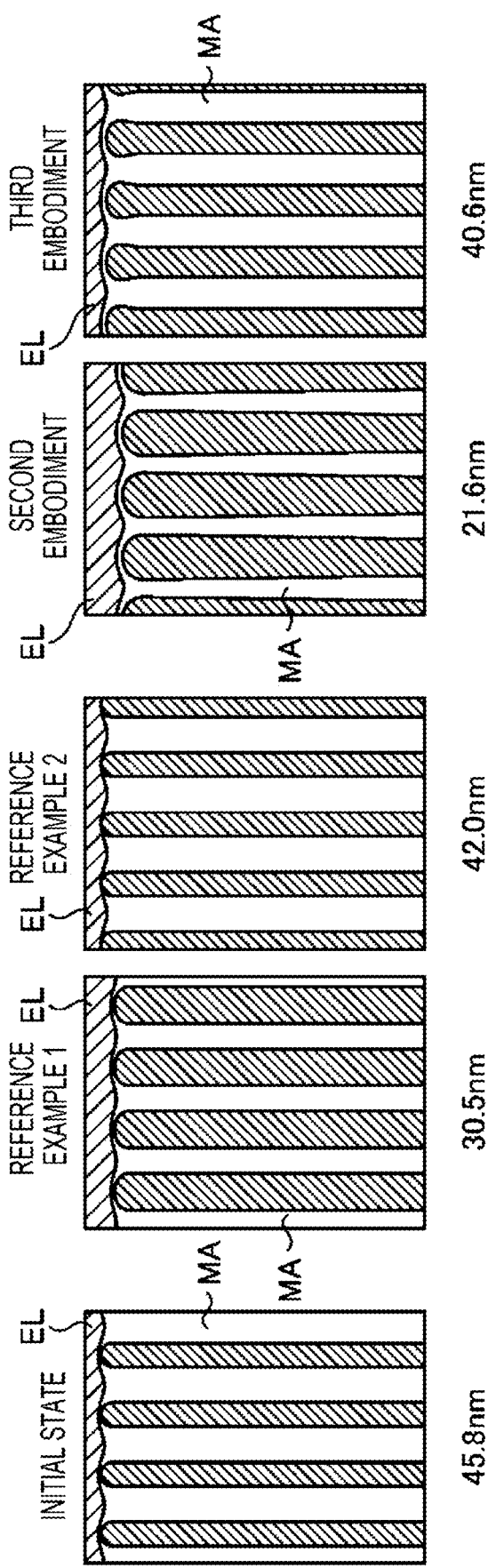

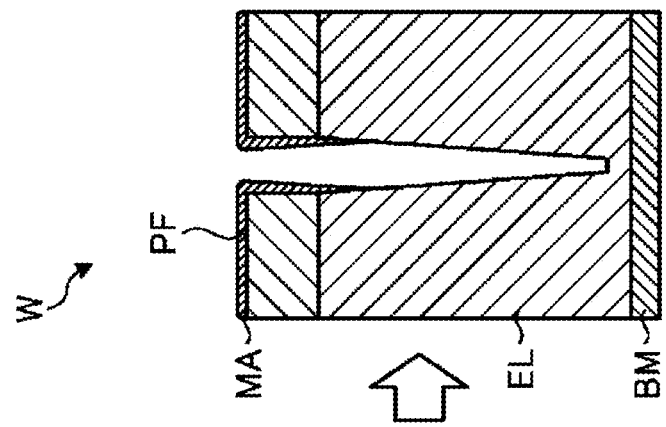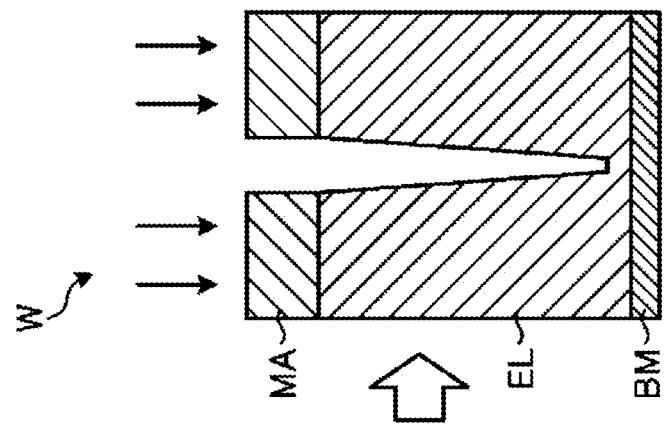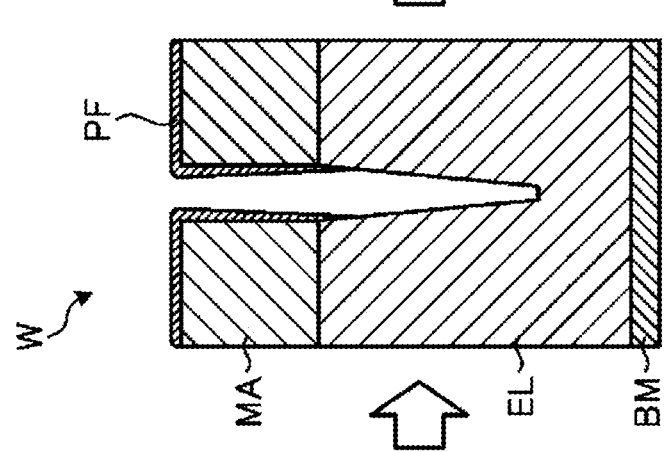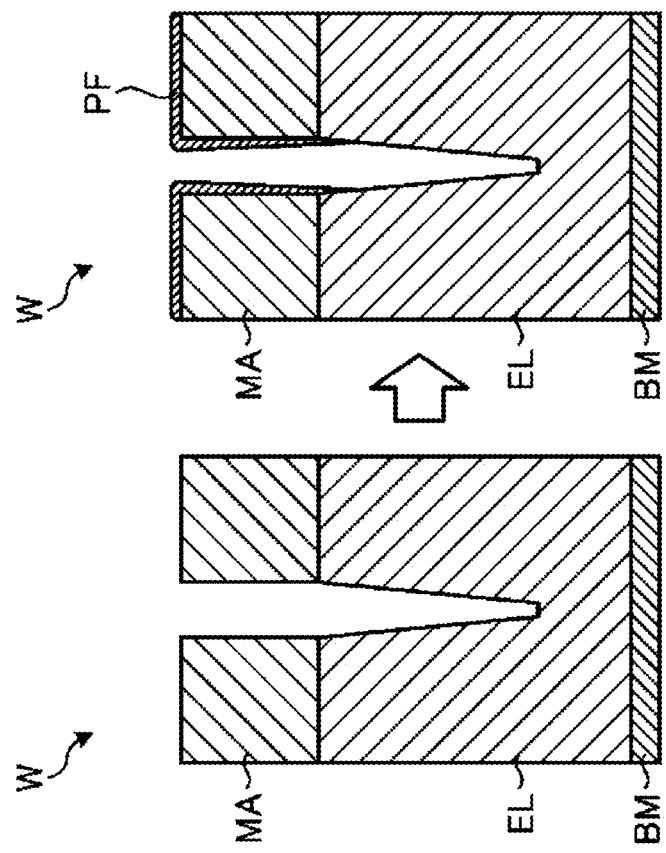

SUBSTRATE PROCESSING METHOD AND SUBSTRATE PROCESSING SYSTEM

CROSS-REFERENCE TO RELATED APPLICATION

This application is based on and claims priority from Japanese Patent Application No. 2020-190713, filed on Nov. 17, 2020, with the Japan Patent Office, the disclosure of which is incorporated herein in its entirety by reference.

TECHNICAL FIELD

The present disclosure relates to a substrate processing method and a substrate processing system.

BACKGROUND

As the integration of semiconductor devices progresses not only in the horizontal direction but also in the vertical direction, the aspect ratio of a pattern formed in a process of manufacturing the semiconductor device also increases. For example, in manufacturing a 3D NAND, the channel holes are formed in a direction penetrating a large number of metal wiring layers. When a 64-layer memory cell is formed, the aspect ratio of each channel hole is as high as 45.

Various methods have been proposed for forming a pattern having a high aspect ratio with a high accuracy. For example, a method has been proposed which repeatedly performs an etching and a film formation in an opening formed in a dielectric material of a substrate, thereby suppressing a lateral etching (U.S. Patent Laid-Open Publication No. 2016/0343580). Further, a method has been proposed which combines an etching and a film formation with each other to form a protective film for preventing the lateral etching of the dielectric layer (U.S. Patent Laid-Open Publication No. 2018/0174858).

SUMMARY

According to an aspect of the present disclosure, a substrate processing method includes steps (a) to (f). In step (a), a substrate is carried into a first chamber, and the substrate has a first film, which is a processing target, with a recess formed therein, and a mask provided on the first film with an opening formed at a position of the mask corresponding to the recess. In step (b), a temperature of the substrates is adjusted to 200° C. or higher. In step (c), a second film which is a silicon nitride film is formed on a side wall of the recess. In step (d), the substrate is carried into a second chamber different from the first chamber. In step (e), the temperature of the substrate is adjusted to 100° C. or lower. In step (f), a bottom of the recess is etched. Further, step (c) includes steps (c-1) and (c-2). In step (c-1), silicon-containing reactive species are supplied into the first chamber, thereby adsorbing the silicon-containing reactive species onto the side wall of the recess. In step (c-2), nitrogen-containing reactive species are supplied into the first chamber to cause a reaction between the silicon-containing reactive species adsorbed onto the side wall of the recess and the nitrogen-containing reactive species, thereby forming the second film on the side wall of the recess. Further, a film thickness of the second film is 20 nm or less. Further, (a) to (f) are repeated twice or more in this order until an aspect ratio becomes 50 or more, and the aspect ratio indicates a ratio of a depth dimension from the opening of the mask to the bottom of the recess, to a dimension of the opening of the mask.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 3A and 3B are views illustrating an example of a distribution of a critical dimension (CD) in the depth direction of a recess.

FIGS. 10A to 10D are views illustrating an example of a processing process in the substrate processing method according to the modification of the second embodiment.

FIGS. 11A to 11D are views illustrating another example of the processing process in the substrate processing method according to the modification of the second embodiment.

FIGS. 15A to 15E are views illustrating an example of a cross section of a processed recess.

FIGS. 19A to 19D are views illustrating an example of a processing process in the substrate processing method according to the fifth embodiment.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of a substrate processing method and a substrate processing system of the present disclosure will be described in detail based on the drawings. The substrate processing method and the substrate processing system of the present disclosure are not limited to the embodiments. Further, the embodiments may be appropriately combined with each other within the scope that does not cause any inconsistency in processing contents.

It is known that a shape abnormality occurs when a pattern with a high aspect ratio is etched. For example, when an opening is formed in the vertical direction, there may occur a shape abnormality in which the inner peripheral surface of the opening expands in the horizontal direction. This shape abnormality is called a bowing. In order to suppress the occurrence of the shape abnormality, a method has been proposed which forms a protective film on the side wall of the opening. In forming a fine pattern, it is preferable to prevent, for example, a closing of the opening due to the protective film or a decrease in etching rate due to a film formation on the bottom of the opening.

In the descriptions herein below, a "pattern" refers to all shapes formed in a substrate. A pattern indicates all of a plurality of shapes formed in a substrate such as, for example, holes, trenches, and line-and-space. A "recess" refers to a portion corresponding to a shape dented in a thickness direction of the substrate in a pattern formed in the substrate. The recess has a "side wall" which is the inner peripheral surface of the dented shape, a "bottom" which is the bottom of the dented shape, and a "top" which is continuous with the side wall and is the surface of the substrate near the side wall. The space surrounded by the top is called an "opening." Here, the term "opening" is also used to indicate the entire space surrounded by the bottom and the side wall of the recess or an arbitrary position in the space. The recess is an example of a semiconductor pattern.

First Embodiment

[Substrate Processing Method]

Figure 1:
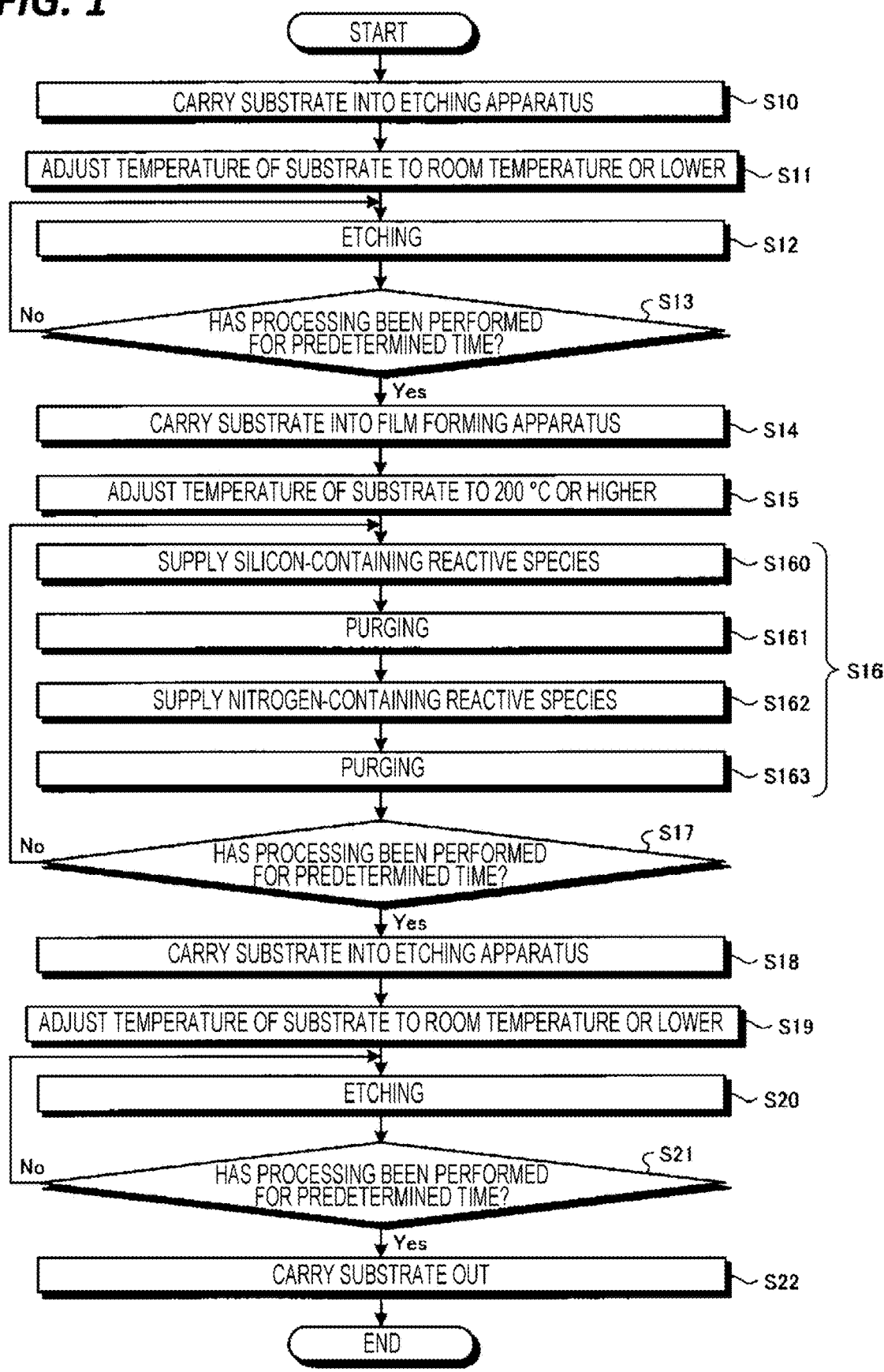
FIG. 1 is a flowchart illustrating an example of a plasma processing method according to a first embodiment of the present disclosure.

FIG. 1 is a flowchart illustrating an example of a substrate processing method according to a first embodiment of the present disclosure. The process illustrated in FIG. 1 is performed by a substrate processing system 1 to be described later with reference to FIG. 4. In the following descriptions, the process illustrated in FIG. 1 will be described referring to FIGS. 2A to 2D.

Figure 2A:
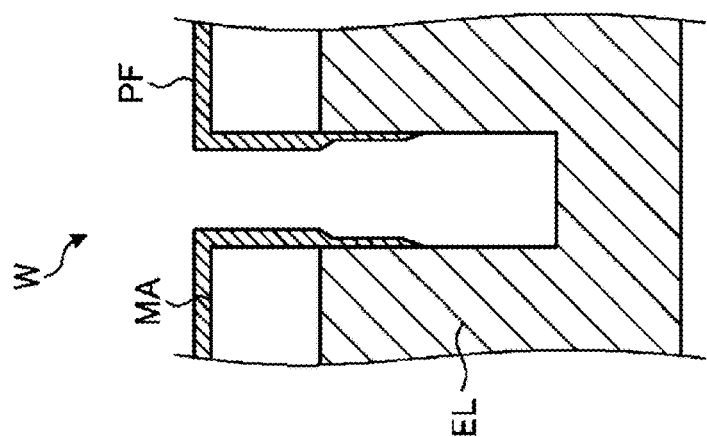
FIGS. 2A to 2D are views illustrating an example of a processing process in the substrate processing method according to the first embodiment.

First, a substrate W which is a processing target is carried into an etching apparatus 12 to be described later (step S10). In step S10, for example, the substrate W obtained by stacking a mask MA with a predetermined pattern formed therein on a film EL to be etched as illustrated in FIG. 2A is carried into the etching apparatus 12. The film EL is an example of a first film. The etching apparatus 12 is an example of a second chamber. In the present embodiment, the film EL is a multilayer film having a silicon oxide film and a silicon nitride film. Further, the film EL may be a silicon-containing film or an organic film. Examples of the silicon-containing film include a silicon nitride film, a polycrystalline silicon film, a carbon-containing silicon film, and a silicon germanium film. Further, the silicon-containing film may be a stacked film that includes at least two of a polycrystalline silicon film, a silicon oxide film, and a silicon nitride film.

Next, the temperature of the substrate W is adjusted to a predetermined temperature which is 100° C. or lower (S11). In step S11, the temperature of the substrate W is adjusted to, for example, 0° C.

Figure 2B:
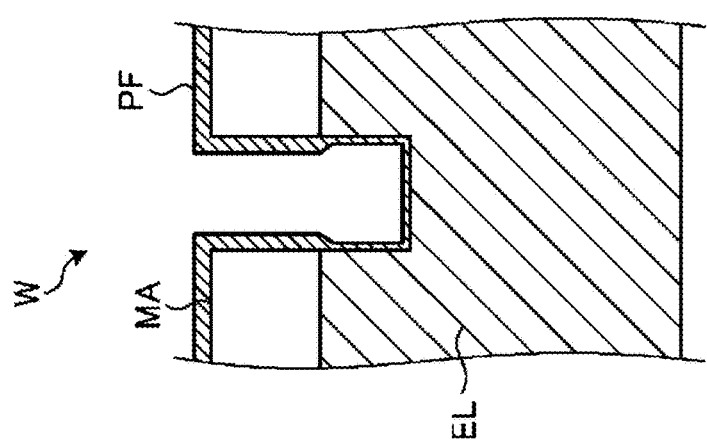

Next, the film EL is etched in the thickness direction of the film EL along the shape of the mask MA (S12). As a result, for example, the recess illustrated in FIG. 2B is formed in the film EL along the opening of the mask MA.

Next, a control device of the substrate processing system 1 determines whether the processing of step S12 is performed for a predetermined time (S13). When it is determined that the processing of step S12 has not been performed for the predetermined time (S13: No), the processing of step S12 is performed again. When the time for performing step S12 becomes long, not only the depth of the recess increases, but also the shape abnormality such as bowing occurs in the side wall of the recess. The predetermined time in step S13 refers to a time within a range in which the shape abnormality such as bowing does not occur in the side wall of the recess formed in the film EL.

Meanwhile, when it is determined that the processing of step S12 has been performed for the predetermined time (S13: Yes), the substrate W is carried out from the etching apparatus 12. Then, the substrate W is carried into a film forming apparatus 14 to be described later (S14). The film forming apparatus 14 is an example of a first chamber. Further, step S14 is an example of steps (a) and (h).

Next, the temperature of the substrate W is adjusted to a predetermined temperature which is 200° C. or higher (S15). In step S15, the temperature of the substrate W is adjusted to, for example, 300° C. Step S15 is an example of steps (b) and (i).

Next, a protective film is formed on the surface of the recess (S16). In the present embodiment, the protective film is, for example, a silicon nitride film. The protective film is an example of a second film. Further, step S16 is an example of steps (c) and (j).

In step S16, first, a gas of silicon-containing reactive species (precursor) is supplied to the surface of the substrate W (S160). Step S160 is an example of step (c-1). As a result, the molecules of the precursor are adsorbed onto the surface of the substrate W. As the precursor gas, an aminosilane-based gas, for example, a gas of $SiCl_4$, dichlorosilane (DCS), or hexachlorodisilane (HCDS) is used.

Prior to the start of step S160, a process may be performed for converting a gas containing nitrogen and hydrogen into plasma in the film forming apparatus 14, thereby terminating the surface of the substrate W with an amino group. As a result, the molecules of the precursor may be more efficiently adsorbed onto the surface of the substrate W. The process of terminating the surface of the substrate W with an amino group is an example of step (c-0).

Next, the surface of the substrate W is purged with a purge gas (S161). As a result, the molecules of the precursor excessively adsorbed onto the surface of the substrate W are removed. As for the purge gas, for example, a noble gas such as argon gas or an inert gas such as nitrogen gas is used.

Next, a gas of nitrogen-containing reactive species (reaction gas) is supplied to the surface of the substrate W (S162). Step S162 is an example of step (c-2). As a result, the molecules of the precursor adsorbed onto the surface of the substrate W are nitrided, and a protective film is formed on the surface of the substrate W. As for the reaction gas, a gas such as $N_2$ or $NH_3$ may be used. The gas of nitrogen-containing reactive species may be generated by converting the reaction gas into plasma. As a result, the nitrogen-containing reactive species having a relatively higher reactivity may be produced, so that the time required for forming the protective film may be reduced. Further, when the pattern is a hole, the molecules of the reaction gas may hardly reach the bottom of the pattern. In this case, in step (c-2), a bias voltage may be applied to a lower electrode on which the substrate W is placed. As a result, the molecules of the reaction gas may reach the bottom of the pattern.

Next, the surface of the substrate W is purged with the purge gas (S163). As a result, the excessively supplied reaction gas is discharged.

Next, the control device of the substrate processing system 1 determines whether the processing of step S16 has been performed for a predetermined time (S17). When it is determined that the processing of step S16 has not been performed for the predetermined time (S17: No), the processing of step S16 is performed again. The predetermined time in step S17 refers to a time for which the protective film formed on the side wall of the recess has a predetermined thickness. In the present embodiment, the predetermined thickness is, for example, 20 nm or less. Preferably, the predetermined thickness may be, for example, 10 nm or less. More preferably, the predetermined thickness may be, for example, 5 nm or less. As a result, the time required for forming the protective film may be reduced. In addition, the ratio of the thickness of the protective film formed near the bottom of the recess to the thickness of the protective film formed on the upper portion of the recess may be 0.7 or less.

Figure 2C:
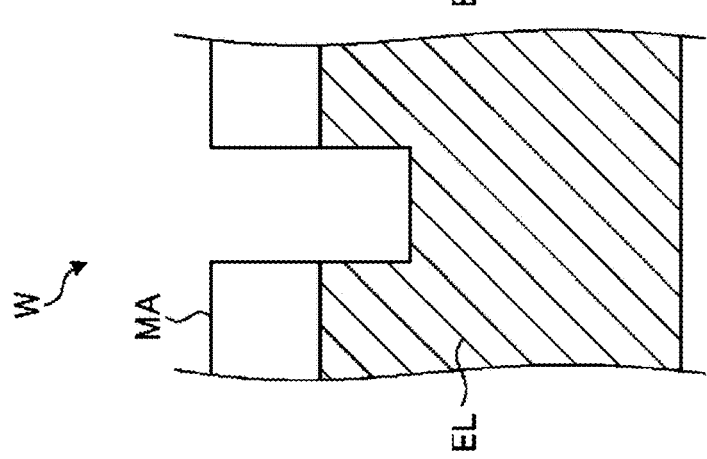

Meanwhile, when it is determined that the processing of step S16 has been performed for the predetermined time (S17: Yes), the substrate W is carried out from the film forming apparatus 14. As a result, for example, a protective film PF is formed on the surface of the recess of the film EL as illustrated in FIG. 2C. Then, the substrate W is carried into the etching apparatus 12 again (S18). Step S18 is an example of step (d).

Here, in the present embodiment, the film EL is a multi-layer film of a silicon oxide film and a silicon nitride film, and the molecules of the silicon-containing reactive species are easily adsorbed to the mask MA rather than to the film EL. Thus, for example, as illustrated in FIG. 2C, the protective film PF is formed to be thicker on the surface of the mask MA than that on the surface of the film EL. Further, in the present embodiment, the film EL is formed by, for example, a chemical vapor deposition (CVD), and the protective film PF is formed by an atomic layer deposition (ALD). Thus, the silicon nitride film of the film EL and the protective film PF that is a silicon nitride film are different from each other in terms of at least one of a content ratio of silicon atoms and nitrogen atoms, a film density, and a crystal structure.

Next, the temperature of the substrate W is adjusted to a predetermined temperature which is 100° C. or lower (S19). In step S19, the temperature of the substrate W is adjusted to, for example, 0° C. Step S19 is an example of step (e).

Next, the bottom of the recess formed in the film EL is further etched along the shape of the mask MA (S20). Step S20 is an example of steps (f) and (k). Then, the control device determines whether the processing of step S20 has been performed for a predetermined time (S21). When it is determined that the processing of step S20 has not been performed for the predetermined time (S21: No), the processing of step S20 is performed again. When the time for performing step S20 becomes long, not only the depth of the recess increases, but also the shape abnormality occurs in the side wall of the recess. The predetermined time in step S20 refers to a time within a range in which the shape abnormality such as bowing does not occur in the side wall of the recess formed in the film EL.

Figure 2D:
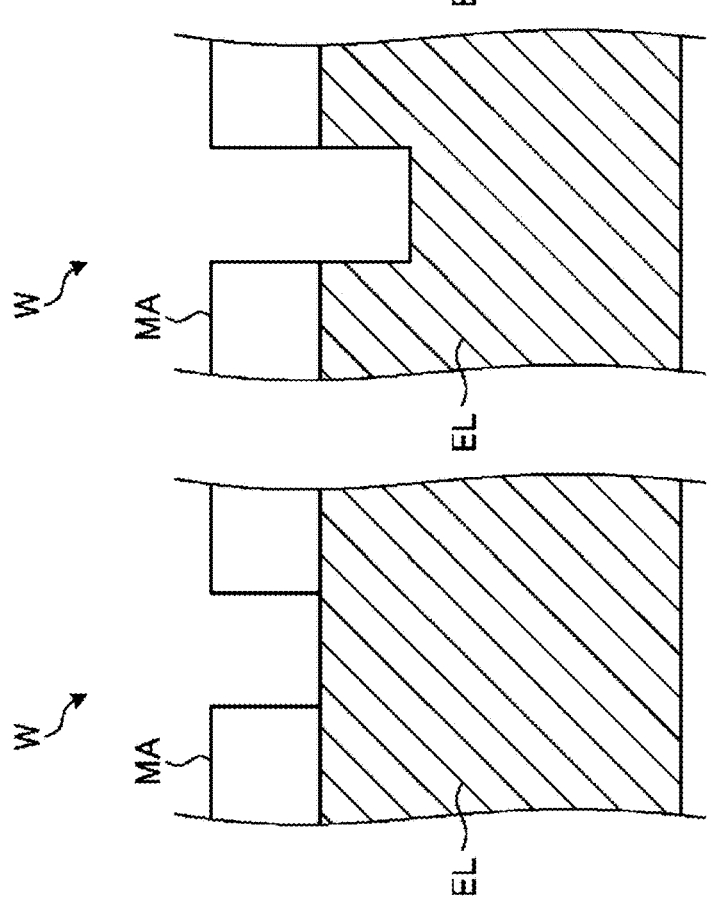

Meanwhile, when the processing of step S20 has been performed for the predetermined time (S21: Yes), the substrate W is carried out from the etching apparatus 12 (S22). As a result, for example, the recess illustrated in FIG. 2D is formed in the film EL along the opening of the mask MA. Then, the substrate processing method illustrated in the present flowchart is completed.

Further, steps S14 to S21 may be repeatedly performed twice or more times in this order. As a result, the recess with a relatively high aspect ratio (A/R) may be formed in the film EL, while suppressing the shape abnormality of the recess. When steps S14 to S21 are repeatedly performed, at least one of the time for supplying the silicon-containing reactive species and the time for supplying the nitrogen-containing reactive species in steps S14 to S21 performed at a later time may be controlled to be longer than that in previously performed steps S14 to S21.

[CD of Recess]

FIGS. 3A and 3B are views illustrating an example of a distribution of a CD in the depth direction of the recess. For example, as illustrated in FIG. 3A, with the boundary between the mask MA and the film EL as a reference, the depth of the recess in the film EL is defined as a negative depth, and the depth of the recess in the mask MA is defined as a positive depth.

The comparative example of FIG. 3B represents the distribution of the CD in the depth direction of the recess in a case where the recess is etched without forming the protective film PF. In the comparative example, the CD increases near the boundary between the mask MA and the film EL. Further, as the depth of the recess increases in the negative direction, the CD decreases. Assuming that the ideal shape of the recess is a rectangular cross-sectional shape, the cross-sectional shape of the recess in the comparative example is abnormal as compared with the ideal shape of the recess.

Meanwhile, in the recess formed by the method of the present embodiment, for example, the increase of the CD near the boundary between the mask MA and the film EL is suppressed to be smaller than that in the comparative example, as illustrated in FIG. 3B. Further, while the CD decreases as the depth of the recess increases in the negative direction in the present embodiment as well, the decrease amount is suppressed to be smaller than that in the comparative example. That is, the method of the present embodiment suppresses the shape abnormality of the recess.

[Configuration of Substrate Processing System 1]

Figure 4:
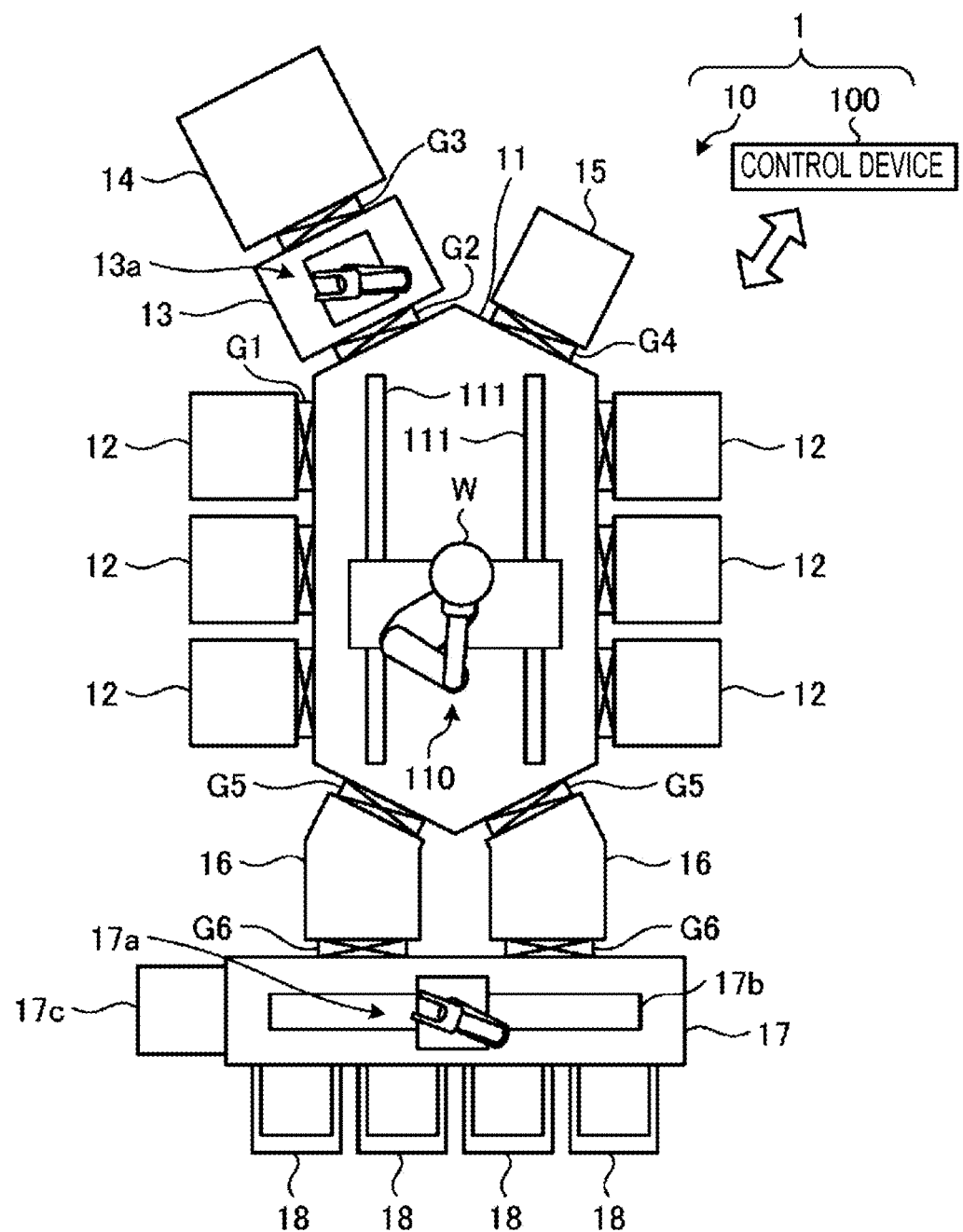
FIG. 4 is a schematic plan view illustrating an example of a substrate processing system.

The process illustrated in FIG. 1 is performed by, for example, a substrate processing system 1 illustrated in FIG. 4. FIG. 4 is a schematic plan view illustrating an example of the substrate processing system 1. For the convenience of descriptions, FIG. 4 illustrates upper parts of some devices to be transparent. The substrate processing system 1 in the present embodiment is a multi-chamber type vacuum processing system. The substrate processing system 1 forms a recess with a predetermined pattern in the substrate W which is the processing target, by using a plurality of etching apparatuses 12 and a film forming apparatus 14.

The substrate processing system 1 includes a main body 10 and a control device 100 that controls each component of the main body 10. The main body 10 includes a vacuum transfer chamber 11. The vacuum transfer chamber 11 has a hexagonal planar shape, and the plurality of etching apparatuses 12 are connected to two of the side walls of the vacuum transfer chamber 11 through gate valves G1, respectively. Further, a vacuum transfer chamber 13 is connected to one of the other side walls of the vacuum transfer chamber 11 via a gate valve G2. Further, a storage chamber 15 is connected to another one of the other side walls of the vacuum transfer chamber 11 via a gate valve G4. Further, load lock chambers 16 are connected to the other two side walls of the vacuum transfer chamber 11 via gate valves G5.

The inside of the vacuum transfer chamber 11 is exhausted by a vacuum pump and maintained at a predetermined degree of vacuum. A transfer device 110 such as a robot arm is provided inside the vacuum transfer chamber 11. The transfer device 110 moves in the vacuum transfer chamber 11 along guide rails 111 provided in the vacuum transfer chamber 11. The transfer device 110 transfers the substrate W among the etching apparatuses 12, the vacuum transfer chamber 13, the storage chamber 15, and the load lock chambers 16. The transfer device 110 is an example of a second transfer device.

Each etching apparatus 12 is a single-wafer type etching apparatus, and etches the film EL under the mask MA along the shape of the mask MA provided on the substrate W. The film forming apparatus 14 is connected to the vacuum transfer chamber 13 via a gate valve G3. In the vacuum transfer chamber 13, a transfer device 13a such as a robot arm is provided to transfer the substrate W. The transfer device 13a transfers the substrate W between the vacuum transfer chamber 11 and the film forming apparatus 14. The transfer device 13a receives the substrate W from the transfer device 110 in the vacuum transfer chamber 11 or the vacuum transfer chamber 13, and places the substrate W on a predetermined boat 144 provided in the film forming apparatus 14. The transfer device 13a is an example of a first transfer device.

The film forming apparatus 14 forms the protective film PF in the recess of the substrate W. In the present embodiment, the film forming apparatus 14 is a batch type film forming apparatus capable of forming the protective film PF on a plurality of substrates W at once. The plurality of substrates W are accommodated in the film forming apparatus 14 side by side, for example, in the vertical direction. As a result, the footprint of the film forming apparatus 14 may be reduced. The plurality of substrates W may be accommodated in the film forming apparatus 14 side by side in a direction other than the vertical direction. The transfer device 13a may move the substrate W in the vertical direction. By repeating the etching of the film EL by the etching apparatus 12 and the formation of the protective film PF by the film forming apparatus 14, the recess with a high A/R is formed in the substrate W while suppressing the shape abnormality.

The substrate W etched by the etching apparatus 12 is temporarily stored in the storage chamber 15 until the substrate W is carried into the film forming apparatus 14. Further, the substrate W with the protective film PF formed thereon by the film forming apparatus 14 is temporarily stored in the storage chamber 15 until the substrate W is carried into the etching apparatus 12.

Each load lock chamber 16 is connected to an atmosphere transfer chamber 17 via a gate valve G6. A plurality of ports 18 is provided on the side surface of the atmosphere transfer chamber 17 to attach thereon carriers C such as front-opening unified pods (FOUP) for accommodating substrates W. Further, an alignment chamber 17c is provided on the side wall of the atmosphere transfer chamber 17 to align substrates W. Further, a downflow of clean air is formed inside the air transfer chamber 17.

A transfer device 17a such as a robot arm is provided in the atmosphere transfer chamber 17. The transfer device 17a moves in the atmospheric transfer chamber 17 along a guide rail 17b provided in the atmospheric transfer chamber 17. The transfer device 17a transfers the substrate W among each carrier C, each load lock chamber 16, and the alignment chamber 17c.

The control device 100 includes a memory, a processor, and an input/output interface. The memory stores, for example, programs executed by the processor and recipes including conditions for each process. The processor executes a program read from the memory, and controls each component of the main body 10 through the input/output interface based on the recipes stored in the memory.

[Configuration of Etching Apparatus 12]

Figure 5:
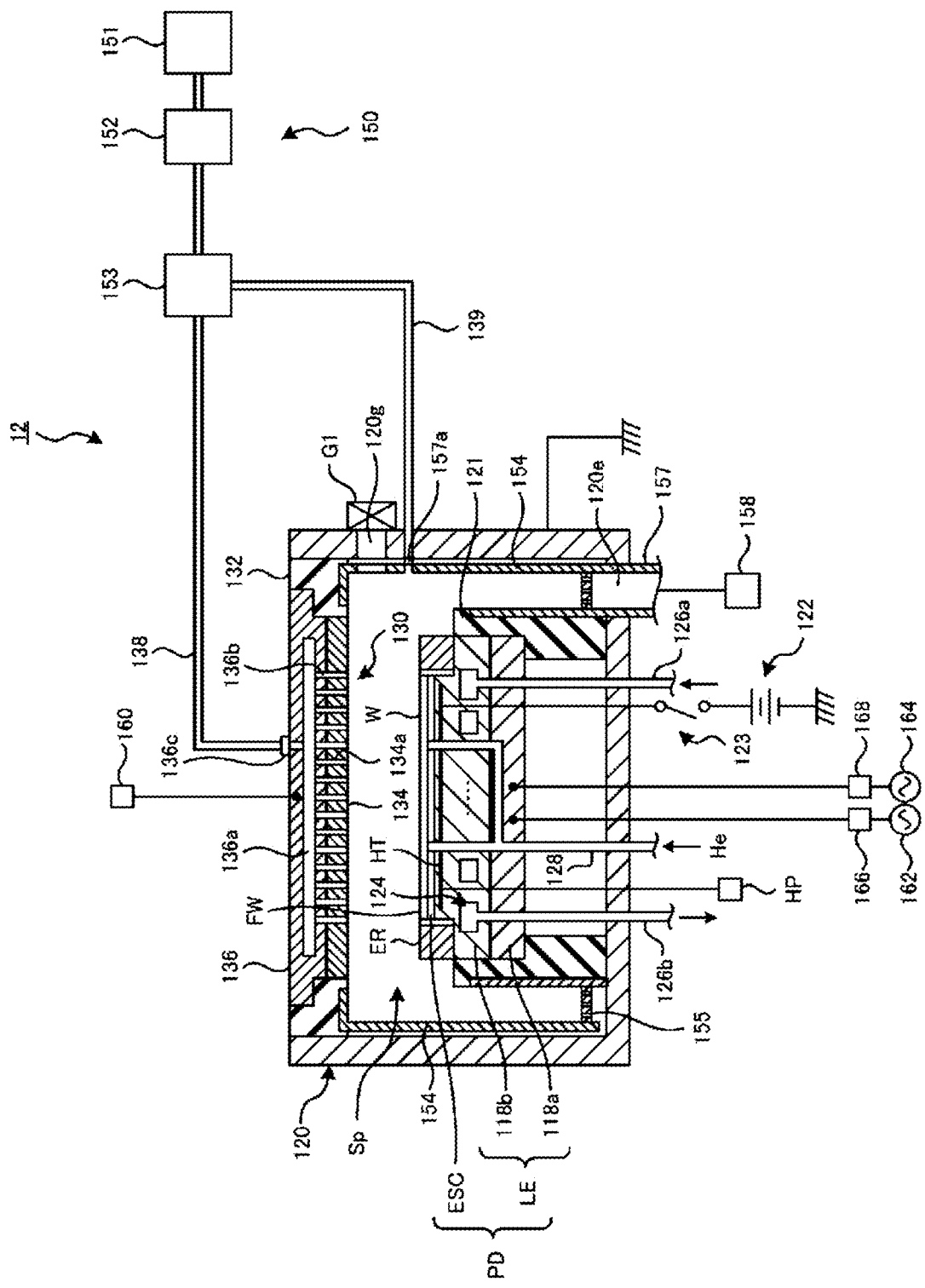
FIG. 5 is a schematic cross-sectional view illustrating an example of an etching apparatus.

FIG. 5 is a schematic cross-sectional view illustrating an example of the etching apparatus 12. In the present embodiment, the etching apparatus 12 is a single-wafer type plasma etching apparatus provided with parallel flat-plate electrodes. The etching apparatus 12 has a processing container 120 having a substantially cylindrical shape. The processing container 120 defines a processing space Sp. The processing container 120 is made of, for example, aluminum, and the inner wall surface thereof is anodized. The processing container 120 is grounded for security.

A substantially cylindrical support member 121 is provided on the bottom of the processing container 120. The support member 121 is made of an insulating material that may contain oxygen, such as, for example, quartz. For example, the support member 121 extends vertically from the bottom of the processing container 120, inside the processing container 120. A stage PD is provided in the processing container 120. The stage PD is supported by the support member 121.

The stage PD holds the substrate W on the upper surface thereof. The surface FW of the substrate W etched by the etching apparatus 12 is the surface of the substrate W opposite to the back surface thereof in contact with the upper surface of the stage PD, and faces an upper electrode 130. The stage PD includes a lower electrode LE and an electrostatic chuck ESC. The lower electrode LE includes a first plate 118a and a second plate 118b which have a substantially disc shape. The first plate 118a and the second plate 118b are made of, for example, a metal such as aluminum. The second plate 118b is provided on the first plate 118a, and electrically connected to the first plate 118a.

The electrostatic chuck ESC is provided on the second plate 118b. The electrostatic chuck ESC has a structure in which an electrode that is a conductive film is disposed between a pair of insulating layers or between a pair of insulating sheets. A DC power supply 122 is electrically connected to the electrode of the electrostatic chuck ESC via a switch 123. When the substrate W is placed on the stage PD, the back surface of the substrate W (the surface opposite to the surface FW) is in contact with the electrostatic chuck ESC. The electrostatic chuck ESC attracts the substrate W thereto by an electrostatic force such as a Coulomb force generated by a DC voltage from the DC power supply 122. As a result, the electrostatic chuck ESC may hold the substrate W.

An edge ring ER is disposed on the peripheral edge of the second plate 118b to surround the edge of the substrate W and the electrostatic chuck ESC. The edge ring ER is provided to improve the uniformity of the etching. The edge ring ER is made of a material appropriately selected according to a material of a film to be etched, and may be made of, for example, silicon or quartz.

A flow path 124 is provided inside the second plate 118b. A coolant is supplied to the flow path 124 from a chiller unit (not illustrated) provided outside the processing container 120 via a pipe 126a. The coolant supplied to the flow path 124 via the pipe 126a is returned to the chiller unit via the pipe 126b. As a result, the coolant of which temperature is controlled by the chiller unit circulates in the flow path 124. By controlling the temperature of the coolant, the temperature of the substrate W may be controlled through the electrostatic chuck ESC.

The stage PD is provided with a pipe 128. The pipe 128 supplies a heat transfer gas from a heat transfer gas supply mechanism (not illustrated) to the space between the electrostatic chuck ESC and the substrate W. As for the heat transfer gas, for example, helium gas may be used.

The stage PD is provided with a heater HT that adjusts the temperature of the substrate W. The heater HT is built in the electrostatic chuck ESC. A heater power supply HP is connected to the heater HT. When a power is supplied from the heater power supply HP to the heater HT, the temperature of the electrostatic chuck ESC is adjusted, and the temperature of the substrate W placed on the electrostatic chuck ESC is adjusted. The heater HT may be embedded in the second plate 118b. When the substrate W is etched, the heater HT controls a heating amount with respect to a cooling amount of the coolant flowing through the flow path 124, so as to adjust the temperature of the substrate W to be 100° C. or lower, for example, 0° C. The heater HT is an example of a second temperature adjuster.

The upper electrode 130 is provided above the stage PD. The upper electrode 130 is disposed above the stage PD to face the stage PD. The lower electrode LE and the upper electrode 130 are provided substantially in parallel with each other, and make up the parallel flat-plate electrodes. The processing space Sp is provided between the upper electrode 130 and the lower electrode LE, to perform a processing on the substrate W.

The upper electrode 130 is supported in the upper portion of the processing container 120 via an insulating member 132. The insulating member 132 is made of an insulating material that may contain oxygen, such as, for example, quartz. The upper electrode 130 includes an electrode plate 134 and an electrode support 136. The electrode plate 134 faces the processing space Sp, and a plurality of gas ejection ports 134a are formed in the electrode plate 134. The electrode plate 134 includes, for example, silicon. The electrode plate 134 may be, for example, silicon.

The electrode support 136 is made of a conductive material such as, for example, aluminum, and supports the electrode plate 134 in a detachable manner. The electrode support 136 may have a water-cooled structure. A gas diffusion chamber 136a is provided inside the electrode support 136. The gas diffusion chamber 136a communicates with the processing space Sp through a plurality of gas flow ports 136b that communicates with the gas ejection ports 134a. A pipe 138 is connected to the gas diffusion chamber 136a via a gas introduction port 136c. A gas supply 150 is connected to the pipe 138.

The main body 10 includes a first radio frequency (RF) power supply 162 and a second RF power supply 164. The first RF power supply 162 is a power supply that generates a first RF power for generating plasma, and generates an RF power having a frequency of 27 MHz to 100 MHz, for example, 60 MHz. Further, the first RF power supply 162 outputs the generated RF power in a pulse form. The frequency of the pulse is controllable in a range of, for example, 0.1 kHz to 50 kHz, and the duty ratio of the pulse is controllable in a range of, for example, 5% to 100%. The first RF power supply 162 is connected to the lower electrode LE via a matching unit 166. The matching unit 166 is a circuit for matching the output impedance of the first RF power supply 162 and the input impedance of the load side (the lower electrode LE) with each other. The first RF power supply 162 may be connected to the upper electrode 130 via the matching unit 166.

The second RF power supply 164 is a power supply that generates a second RF wave power for drawing ions into the substrate W, that is, an RF bias power, and generates an RF bias power of a frequency in a range of 400 kHz to 40.68 MHz, for example, a frequency of 13.56 MHz. Further, the second RF power supply 164 outputs the generated RF bias power in a pulse form. The frequency of the pulse is controllable in a range of, for example, 0.1 kHz to 50 kHz, and the duty ratio of the pulse is controllable in a range of, for example, 5% to 100%. The second RF power supply 164 is connected to the lower electrode LE of the substrate processing system 1 via a matching unit 168. The matching unit 168 is a circuit for matching the output impedance of the second RF power supply 164 and the input impedance of the load side (the lower electrode LE) with each other.

A power supply 160 is connected to the electrode support 136 of the upper electrode 130. The power supply 160 applies a voltage to the upper electrode 130, in order to draw positive ions existing in the processing space $S_p$ into the electrode plate 134. The power supply 160 is, for example, a DC power supply that generates a negative DC voltage. When the voltage is applied from the power supply 160 to the upper electrode 130, the positive ions existing in the processing space $S_p$ collide with the electrode plate 134. As a result, secondary electrons, silicon, or both secondary electrons and silicon may be emitted from the electrode plate 134.

An exhaust plate 155 is provided between the support member 121 and the side wall of the processing container 120 near the bottom of the processing container 120, and formed by coating, for example, an aluminum material with ceramics such as $Y_2O_3$. An exhaust port 120e is formed at the bottom of the processing container 120 below the exhaust plate 155. An exhaust device 158 is connected to the exhaust port 120e via an exhaust pipe 157. The exhaust device 158 has a vacuum pump such as a turbo molecular pump, and may reduce the space in the processing container 120 to a predetermined degree of vacuum.

An opening 120g is formed in the side wall of the processing container 120 to carry in/out the substrate W. The opening 120 g is opened and closed by a gate valve G1. Further, a gas introduction port 157a is formed in the side wall of the processing container 120. The gas introduction port 157a is formed beside the substrate W placed on the stage PD in the processing container 120. The gas supply unit 150 is connected to the gas introduction port 157a via a pipe 139. The gas supply unit 150 is an example of a second gas supply.

The gas supply 150 includes a gas source group 151, a flow rate controller group 152, and a valve group 153. The gas source group 151 includes a plurality of gas sources. The plurality of gas sources may include various gas sources such as, for example, a source of a fluorocarbon-based gas ($C_xF_y$ gas (x and y are each an integer of 1 to 10)) and a source of an inert gas. As for the inert gas, any gas such as nitrogen gas, argon gas, or helium gas may be used.

The flow rate controller group 152 includes a plurality of flow rate controllers such as mass flow controllers, and the valve group 153 includes a plurality of valves. Each of the plurality of gas sources in the gas source group 151 is connected to the pipes 138 and 139 via the corresponding flow rate controller in the flow rate controller group 152 and the corresponding valve in the valve group 153. As a result, the main body 10 may supply the gas supplied from one or more gas sources selected from the plurality of gas sources of the gas source group 151 into the processing space $S_p$ of the processing container 120 through the pipes 138 and 139, at an individually adjusted flow rate.

A deposit shield 154 is detachably provided on the inner side wall of the processing container 120. The deposit shield 154 is also provided on the outer periphery of the support member 121. The deposit shield 154 prevents etching by-products (deposits) from adhering to the members inside the processing container 12. The deposit shield 154 may be formed by coating a member made of aluminum or the like with ceramics such as $Y_2O_3$. The deposit shield 154 may be made of, for example, a material containing oxygen such as quartz, other than $Y_2O_3$.

[Configuration of Film Forming Apparatus 14]

Figure 6:
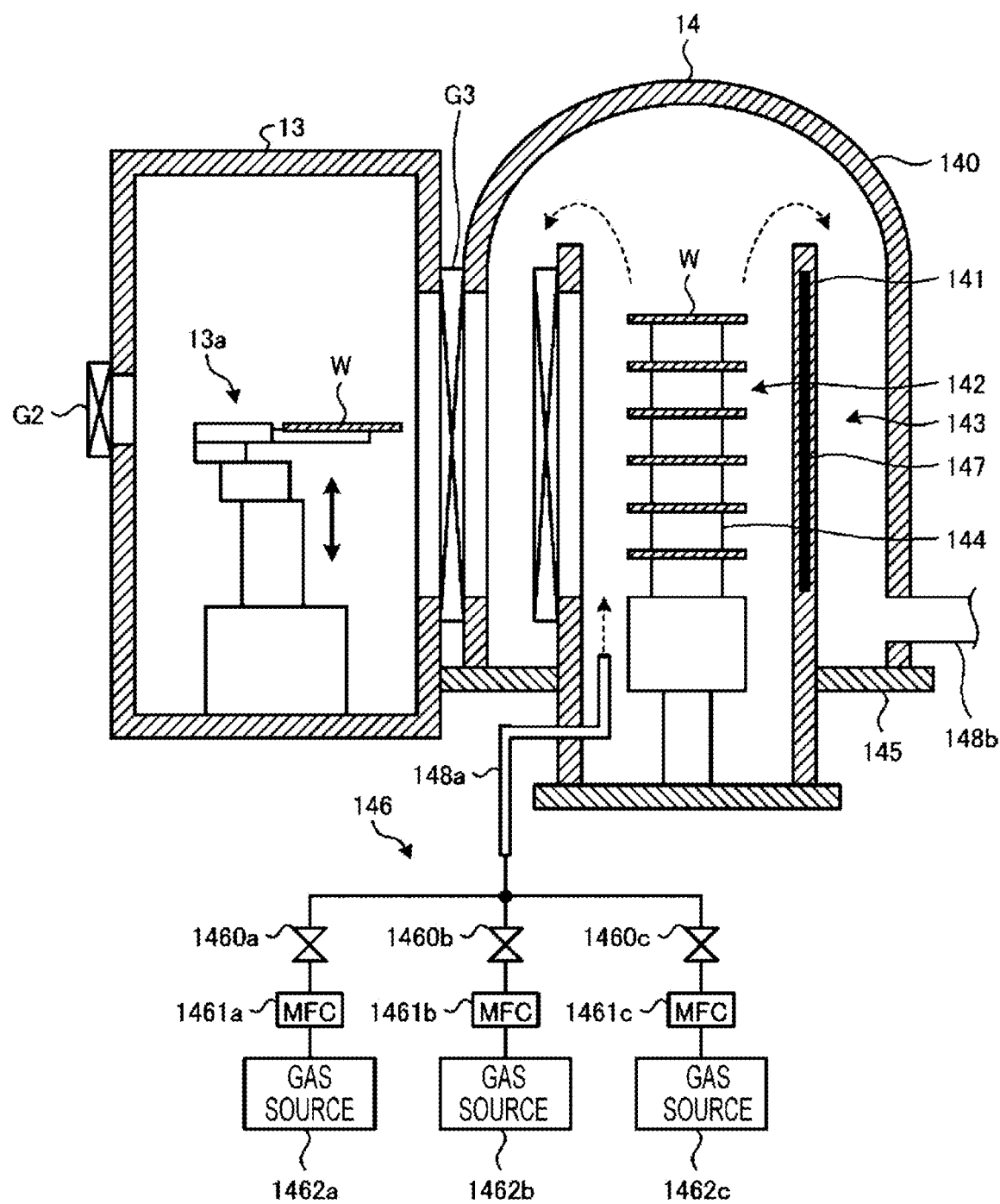
FIG. 6 is a schematic cross-sectional view illustrating an example of a film forming apparatus.

FIG. 6 is a schematic cross-sectional view illustrating an example of a film forming apparatus 14. FIG. 6 also illustrates the vacuum transfer chamber 13.

In the vacuum transfer chamber 13, the transfer device 13a is provided. The transfer device 13a is able to move the substrate W in the direction intersecting the horizontal plane (e.g., in the vertical direction).

The film forming apparatus 14 includes a substantially cylindrical outer wall 140 having a ceiling, and an inner wall 141 provided inside the outer wall 140. The outer wall 140 and the inner wall 141 are made of, for example, quartz. An annular space 143 is formed between the outer wall 140 and the inner wall 141. The outer wall 140 and the inner wall 141 are bonded to a base member 145.

A boat 144 is provided in a processing chamber 142 inside the inner wall 141. The boat 144 holds the plurality of substrates W side by side in the direction intersecting the horizontal plane (e.g., in the vertical direction). As a result, the film forming apparatus 14 may collectively form the protective film PF on the plurality of substrates W. Further, by holding the plurality of substrates W side by side in the direction intersecting the horizontal plane (e.g., the vertical direction), the footprint of the film forming apparatus 14 may be reduced.

A gas is supplied into the processing chamber 142 inside the inner wall 141 via a pipe 148a. The gas supplied into the processing chamber 142 is exhausted from a pipe 148b through the annular space 143 between the outer wall 140 and the inner wall 141.

A gas supply 146 is connected to the pipe 148a. The gas supply 146 is an example of a first gas supply. The gas supply 146 includes a plurality of valves 1460a to 1460c, a plurality of mass flow controllers (MFC) 1461a to 1461c, and a plurality of gas sources 1462a to 1462c. The gas source 1462a is a supply source of a precursor gas. The gas source 1462b is a supply source of a purge gas. The gas source 1462c is a supply source of a reaction gas. In the present embodiment, the precursor gas is a gas containing silicon-containing reactive species such as $SiCl_4$, dichlorosilane (DCS), or hexachlorodisilane (HCDS). Further, in the present embodiment, the purge gas is a noble gas such as argon gas or an inert gas such as nitrogen gas. Further, in the present embodiment, the reaction gas is a gas containing nitrogen-containing reactive species such as $N_2$ or $NH_3$.

A heater 147 is provided in the inner wall 141. The heater 147 adjusts the temperature of the substrate W to, for example, 200° C. or higher when the protective film PF is formed. In the present embodiment, the heater 147 adjusts the temperature of the substrate W to, for example, 300° C. when the protective film PF is formed. The heater 147 is an example of a first temperature adjuster.

The first embodiment has been described. As described above, the substrate processing method in the present embodiment includes steps (a), (b), (c), (d), (e), and (f). In step (a), the substrate W obtained by forming a recess in the film EL to be processed is carried into the film forming apparatus 14. In step (b), the temperature of the substrate W is adjusted to 200° C. or higher. In step (c), the protective film PF which is a silicon nitride film is formed on the side wall of the recess. In step (d), the substrate W is carried into the etching apparatus 12 different from the film forming apparatus 14. In step (e), the temperature of the substrate W is adjusted to 100° C. or lower. In step (f), the bottom of the recess is etched. As a result, the shape abnormality of the semiconductor pattern formed in the substrate W may be suppressed.

Further, in the embodiment described above, step (c) includes steps (c-1) and (c-2). In step (c-1), silicon-containing reactive species are supplied into the film forming apparatus 14, so that the silicon-containing reactive species are adsorbed onto the side wall of the recess. In step (c-2), nitrogen-containing reactive species are supplied into the film forming apparatus 14 to react the nitrogen-containing reactive species with the silicon-containing reactive species adsorbed onto the side wall of the recess, so that the protective film PF is formed on the side wall of the recess. As a result, the protective film PF having a predetermined thickness may be formed on the side wall of the recess.

Further, in the embodiment described above, the nitrogen-containing reactive species may be produced by converting a nitrogen-containing gas into plasma. As a result, the nitrogen-containing reactive species having a relatively higher reactivity may be produced, so that the time required for forming the protective film PF may be shortened.

Further, in the embodiment described above, step (c) may include step (c-0) performed prior to step (c-1). In step (c-0), by converting a gas containing nitrogen and hydrogen into plasma in the film forming apparatus 14, the surface of the substrate W is terminated with an amino group. As a result, the molecules of the precursor may be efficiently adsorbed onto the surface of the substrate W.

Further, in the embodiment described above, it is preferable that in step (c), the protective film PF of 20 nm or less is formed on the side wall of the recess. More preferably, in step (c), the protective film PF of 10 nm or less may be formed on the side wall of the recess. As a result, the time required for forming the protective film PF may be reduced.

Further, in the embodiment described above, the substrate W is provided with the mask MA on the film EL, and the protective film PF is also formed on the surface of the mask MA in step (c). The thickness of the protective film PF formed on the surface of the mask MA is thicker than the thickness of the protective film PF formed on the side wall of the recess. As a result, the amount of reduction of the mask MA during the etching may be reduced.

Further, in the embodiment described above, the film EL has a silicon oxide film and a silicon nitride film, and the silicon nitride film of the film EL and the protective film PF are different from each other in terms of at least one of a content ratio of silicon atoms and nitrogen atoms, a film density, and a crystal structure.

Further, in the embodiment described above, steps (a) to (f) may be repeatedly performed twice or more times in this order. As a result, the recess having a relatively high A/R may be formed while suppressing the shape abnormality of the recess.

Further, the substrate processing method in the embodiment described above is performed by using the substrate processing system 1 provided with the batch type film forming apparatus 14 capable of accommodating a plurality of substrates W and the plurality of single-wafer type etching apparatuses 12. As a result, the recesses having a predetermined shape may be efficiently formed on the plurality of substrates W.

Further, the substrate processing system 1 in the embodiment described above includes the film forming apparatus 14, the heater 147, the gas supply 146, the etching apparatus 12, the heater HT, the gas supply 150, the transfer devices, and the control device 100. The film forming apparatus 14 accommodates the substrate W with a recess formed in the film EL to be processed. The heater 147 adjusts the temperature of the substrate W accommodated in the film forming apparatus 14. The gas supply 146 supplies a gas into the film forming apparatus 14. The etching apparatus 12 accommodates the substrate W, and is different from the film forming apparatus 14. The heater HT adjusts the temperature of the substrate W accommodated in the etching apparatus 12. The gas supply 150 supplies a gas into the etching apparatus 12. The transfer devices 110 and 13a transfer the substrate W between the film forming apparatus 14 and the etching apparatus 12. The control device 100 performs steps (a) to (f). In step (a), the control device 100 controls the transfer device to carry the substrate W into the film forming apparatus 14. In step (b), the control device 100 controls the heater 147 such that the temperature of the substrate W becomes 200° C. or higher. In step (c), the control device 100 controls the gas supply 146 to form the protective film PF, which is a silicon nitride film, on the side wall of the recess. In step (d), the control device 100 controls the transfer device to carry the substrate W into the etching apparatus 12. In step (e), the control device 100 controls the heater HT such that the temperature of the substrate W becomes 100° C. or lower. In step (f), the control device 100 controls the gas supply 150 to etch the bottom of the recess. As a result, the shape abnormality of the semiconductor pattern formed in the substrate W may be suppressed.

Further, in the embodiment described above, the film forming apparatus 14 is, for example, a batch type film forming apparatus capable of accommodating a plurality of substrates W in the vertical direction, and the etching apparatus 12 is a single-wafer type etching apparatus. As a result, the footprint of the substrate processing system 1 may be reduced.

Further, in the embodiment described above, the transfer devices include the transfer device 110 and the transfer device 13a. The transfer device 13a carries the substrate W into the film forming apparatus 14, and carries the substrate W out of the film forming apparatus 14. The transfer device 110 carries the substrate W into the etching apparatus 12, and carries the substrate W out of the etching apparatus 12. The transfer device 13a may transfer the substrate W in the vertical direction. As a result, the footprint of the substrate processing system 1 may be reduced.

Further, in the embodiment described above, the substrate processing system 1 further includes the storage chamber 15 for storing the substrate W that has been subjected to step (c), for a time period until step (d) is started after step (c) is performed. As a result, the substrate processing system 1 may efficiently process the plurality of substrates W.

Second Embodiment

In the first embodiment, the protective film PF is conformally formed on the side wall of the recess formed in the film EL of the substrate W. In this regard, in the present embodiment, a processing condition is set to prevent a self-controllable adsorption or reaction from being completed on the surface of the recess of the film EL. At least the following two processing modes may be considered.

(1) A precursor P is adsorbed onto the entire surface of the recess of the film EL. Then, a reaction gas R to be introduced is controlled not to spread over the entire surface of the recess.

(2) The precursor P is adsorbed only onto a portion of the surface of the recess of the film EL. Then, the reaction gas to be introduced is caused to react only at the portion of the surface of the recess onto which the precursor P is adsorbed.

As a result, a relatively thicker protective film PF may be formed at the portion where the CD expands in the width direction of the recess, on the side wall of the recess of the film EL, so that the shape abnormality of the recess may be further suppressed. Further, in the present embodiment, the protective film PF is formed on the side wall of the recess by the same method as the substrate processing method illustrated in FIG. 1, except for the points described hereinafter. Further, in the present embodiment as well, the substrate W is processed by the substrate processing system 1 described above with reference to FIGS. 4 to 6.

Figure 7A:
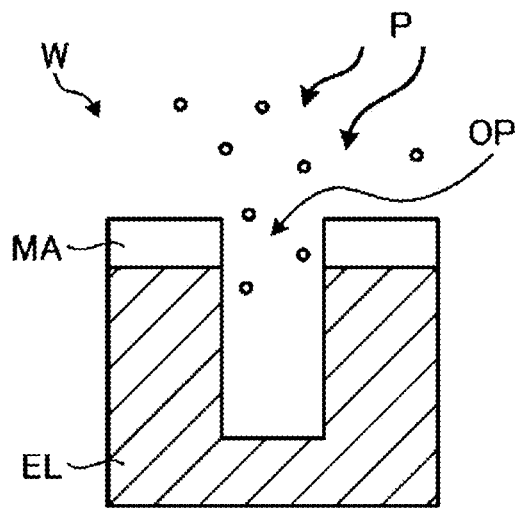
FIGS. 7A to 7D are views illustrating an example of a processing process in a substrate processing method according to a second embodiment.
Figure 7B:
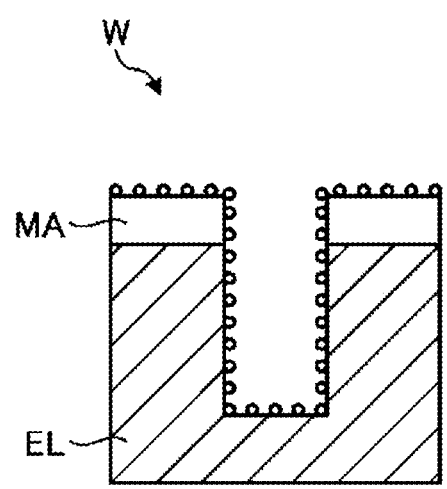

FIGS. 7A to 7D are view illustrating an example of a processing process in the substrate processing method of the second embodiment. In the present embodiment, first, the precursor P is introduced into the film forming apparatus 14 in which the substrate W is placed (FIG. 7A). The molecules of the precursor P enter the recess through an opening OP formed in the film EL of the substrate W, and are adsorbed ono the surface of the recess. By setting a sufficient processing time for adsorbing the molecules of the precursor P onto the entire surface of the recess, the molecules of the precursor P are adsorbed onto the entire surface of the recess (FIG. 7B). When the adsorption of the precursor P is completed, the surface of the substrate W is purged.

Figure 7C:
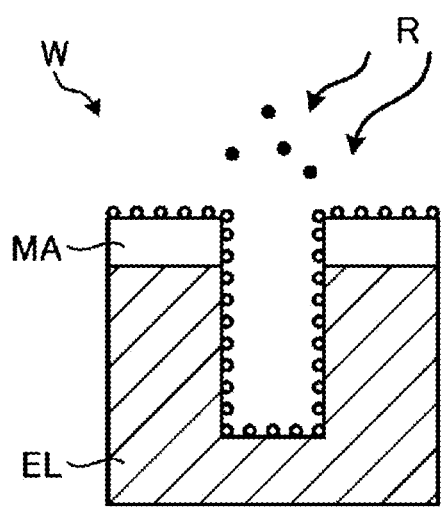
Figure 7D:
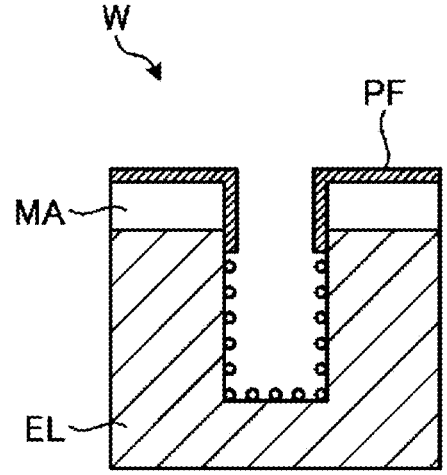

Next, the reaction gas R is introduced into the film forming apparatus 14 (FIG. 7C). The introduced reaction gas R enters the recess while reacting with the precursor P adsorbed onto the surface of the recess. As a result, the protective film PF is gradually formed from the top of the recess. Here, before the protective film PF that is being formed reaches the lower portion of the recess, the supply of the reaction gas R is stopped, and the surface of the substrate W is purged. As a result, while using the ALD method, the protective film PF may be formed only on the upper portion of the side wall of the recess, rather than on the entire side wall of the recess (FIG. 7D). In FIG. 7D, for example, the protective film PF is formed on the surface of the mask MA and near the boundary between the mask MA and the film EL on the side wall of the recess, and is not formed on the lower portion of the side wall of the recess and the bottom of the recess.

Figures 8A, 8B, 8C:
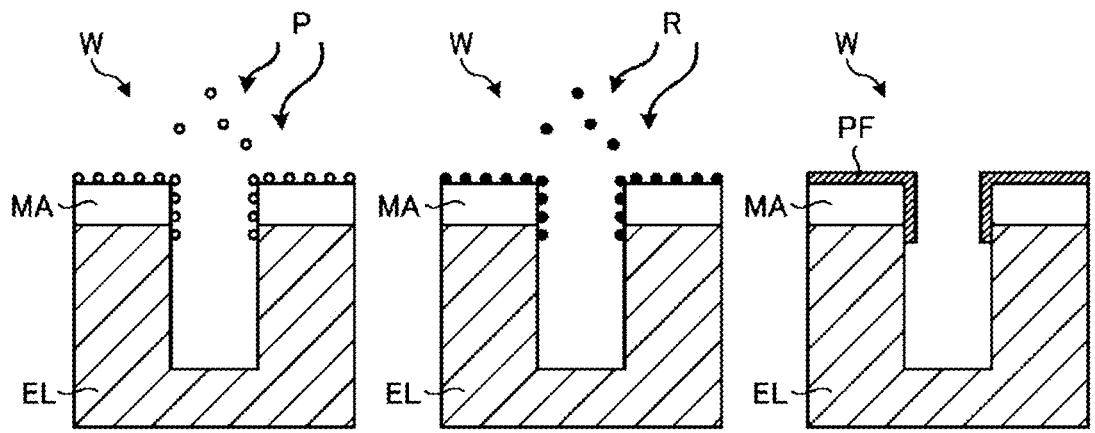
FIGS. 8A to 8C are views illustrating another example of the processing process in the substrate processing method according to the second embodiment.

FIGS. 8A to 8C are views illustrating another example of the processing process in the substrate processing method of the second embodiment. In the example of FIGS. 8A to 8C, the molecules of the precursor P are adsorbed only onto the upper portion of the film EL (FIG. 8A). Then, after the molecules of the precursor P are purged, the reaction gas R is introduced into the film forming apparatus 14 (FIG. 8B). At this time, since the reaction gas R reacts with the molecules of the precursor P only at the position onto which the molecules of the precursor P are adsorbed, the protective film PF is formed only on the upper portion of the recess (FIG. 8C).

As described above, in the substrate processing method according to the present embodiment, the reaction between the precursor P and the reaction gas R occurs only at a predetermined portion of the side wall of the recess. In this case, for example, a processing condition is set such that the adsorption of the molecules of the precursor P occurs on the upper portion of the side wall of the recess, or the reaction of the reaction gas R occurs only at the upper portion of the side wall of the recess. Parameters for setting the processing condition include, for example, the temperature of the substrate W, the pressure in the film forming apparatus 14, the flow rate and the introduction time of the precursor P to be introduced, the flow rate and the introduction time of the reaction gas R to be introduced, and a processing time. Further, in a case where a processing uses plasma, the frequency or magnitude of the RF power supplied for generating plasma may be adjusted.

In the second embodiment described above, when a recess is formed in a shape in which the width of the recess decreases from the upper portion of the recess toward the lower portion thereof, it is possible to implement the control for increasing the dimension of the bottom while suppressing the dimension variation of the side wall using the protective film PF. Further, hereinafter, descriptions will be made on a modification of the second embodiment which is capable of further improving the degree of freedom in controlling the shape of the recess to be formed.

(Substrate Processing Method in Modification)

Figure 9:
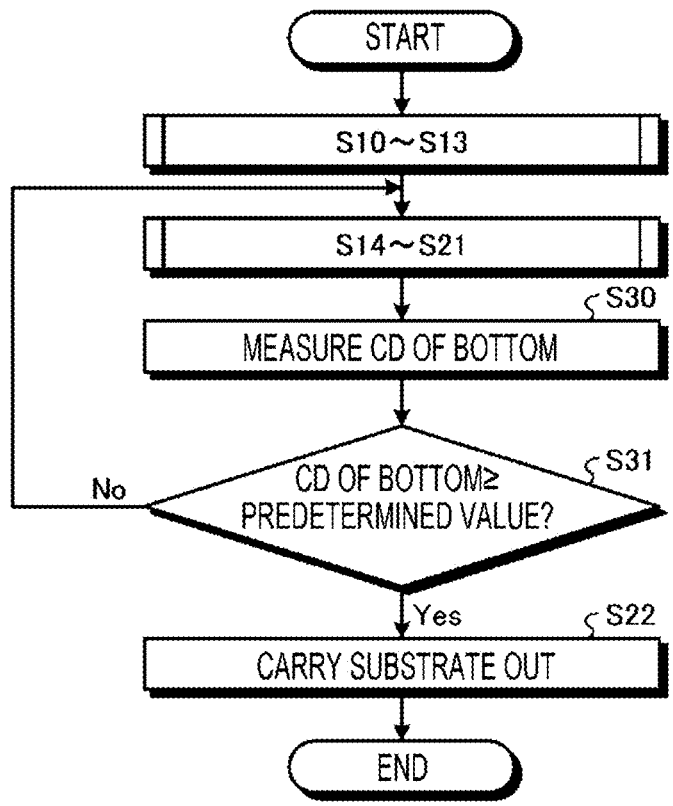
FIG. 9 is a flowchart illustrating an example of a substrate processing method according to a modification of the second embodiment.

FIG. 9 is a flowchart illustrating an example of a substrate processing method according to a modification of the second embodiment. FIG. 9 illustrates only differences from the substrate processing method according to the first embodiment illustrated in FIG. 1. In the present modification, a measuring device is provided in the storage chamber 15 of the substrate processing system 1 illustrated in FIG. 4, to measure the CD of the bottom of the recess.

In the present modification, first, the processes of steps S10 to S13 illustrated in FIG. 1 are performed. Then, the processes of steps S14 to S21 illustrated in FIG. 1 are performed. Then, the substrate W is carried out from the etching apparatus 12, and carried into the storage chamber 15. Then, the CD of the bottom of the recess is measured by the measuring device provided in the storage chamber 15 (S30). The method of measuring the CD of the bottom of the recess is not particularly limited, and for example, an optical method may be used.

Next, the control device 100 determines whether the measured CD of the bottom of the recess is equal to or larger than a predetermined value (S31). When it is determined that the measured CD of the bottom of the recess is less than the predetermined value (S31: No), the process of step S14 is performed again. Meanwhile, when it is determined that the measured CD of the bottom of the recess is equal to or larger than the predetermined value (S31: Yes), the process of step S22 is performed.

FIGS. 10A to 10D are views illustrating an example of the processing process in the substrate processing method according to the modification of the second embodiment. According to the substrate processing method of the modification of the second embodiment, in step S10, for example, the substrate W is carried into the etching apparatus 12, and as illustrated in FIG. 10A, the substrate W is obtained in the manner that the film EL is stacked on a base material BM, and the mask MA with a predetermined pattern formed therein is stacked on the film EL. Then, steps S11 to S13 are performed, so that a recess is formed in the film EL along the pattern formed in the mask MA, for example, as illustrated in FIG. 10B. In the example of FIG. 10B, the bottom of the recess reaches the base material BM.

Then, steps S14 to S17 are performed, so that the protective film PF is formed on the side wall of the recess. At this time, the protective film PF is formed under the processing condition that the reaction between the precursor P and the reaction gas R occurs only at the upper portion of the side wall of the recess. As a result, as illustrated in FIG. 10C, for example, the protective film PF is formed only on the surface of the mask MA and the upper portion of the side wall of the recess. Then, the processes of S18 to S21 are performed.

Then, the CD of the bottom of the recess is measured, and the processes of steps S14 to S21 are repeated until the CD of the bottom of the recess becomes equal to or larger than a predetermined value. As a result, for example, the cross-sectional shape of the recess illustrated in FIG. 10D is obtained, and the shape abnormality of the recess is suppressed.

In the example of FIGS. 10A to 10D, the protective film PF is formed on the side wall of the recess after the bottom of the recess reaches the base material BM by the etching. However, the present disclosure is not limited thereto. As for another example, as illustrated in FIGS. 11A to 11D, the protective film PF may be formed on the side wall of the recess before the bottom of the recess being formed by the etching reaches the base material BM.

Further, in the example of FIGS. 11A to 11D, the protective film PF is formed on a portion of the side wall of the recess. However, as another example, the protective film PF may be formed on the entire side wall and bottom of the recess.

Third Embodiment

In the second embodiment, at least one of the precursor P and the reaction gas R is supplied only to a predetermined portion of the side wall of the recess, such that the reaction between the precursor P and the reaction gas R occurs only at the predetermined portion of the side wall of the recess. Meanwhile, in the present embodiment, an inhibiting factor for inhibiting the adsorption of the precursor P (hereinafter, also referred to as an inhibitor) is formed in advance at a portion of the surface of the recess, so as to control the adsorption position of the precursor P. As a result, the precursor P may be adsorbed at positions in the recess other than the position where the inhibitor is formed, and the protective film PF may be formed at the positions in the recess other than the position where the inhibitor is formed. Further, in the present embodiment, the protective film PF is formed on the side wall of the recess by the same method as the substrate processing method illustrated in FIG. 1, except for the points described below. Further, in the present embodiment as well, the substrate W is processed by the substrate processing system 1 described above with reference to FIGS. 4 to 6.

(Substrate Processing Method)

Figure 12:
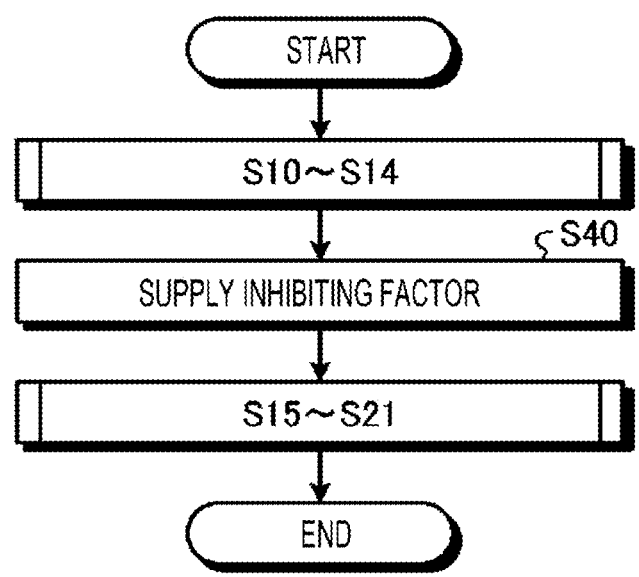
FIG. 12 is a flowchart illustrating an example of a substrate processing method according to a third embodiment.

FIG. 12 is a flowchart illustrating an example of the substrate processing method according to the third embodiment. In the present embodiment, first, the processes of steps S10 to S14 illustrated in FIG. 1 are performed. Then, an inhibitor layer IN is formed as the inhibiting factor on a portion of the surface of the recess (S40). Then, the processes of steps S15 to S22 illustrated in FIG. 1 are performed.

Figure 13A:
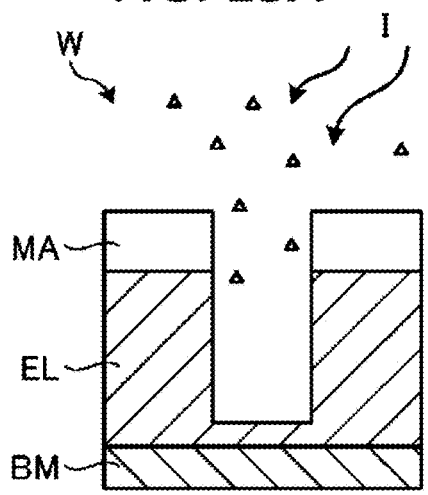
FIGS. 13A to 13E are views illustrating an example of a processing process in the substrate processing method according to the third embodiment.
Figure 13B:
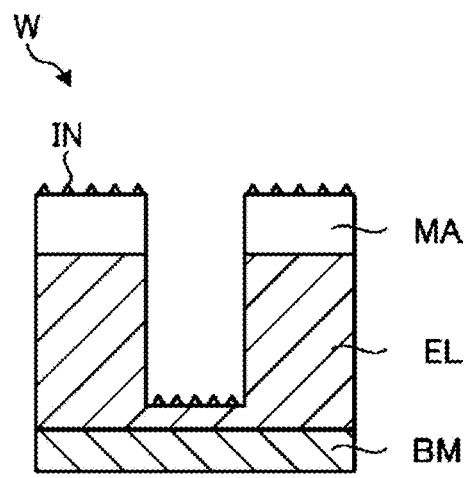

FIGS. 13A to 13E are views illustrating an example of a processing process in the substrate processing method of the third embodiment. In step S40, for example, as illustrated in FIG. 13A, a gas of an inhibitor I is supplied to the surface of the substrate W. The gas containing the inhibitor I is, for example, a gas containing carbon. Examples of the gas containing carbon include fluorocarbon gas, fluorohydrocarbon gas, and hydrocarbon gas. For example, the gas containing the inhibitor I is converted into plasma and supplied to the surface of the substrate W. As a result, the inhibitor layer IN is formed in the recess of the substrate W, for example, as illustrated in FIG. 13B.

When fluorocarbon gas is used as the gas containing the inhibitor I, a fluorocarbon film is formed as the inhibitor layer IN in the recess. When fluorohydrocarbon gas is used as the gas containing the inhibitor I, a fluorohydrocarbon film is formed as the inhibitor layer IN in the recess. When hydrocarbon gas is used as the gas containing the inhibitor I, a hydrocarbon film is formed as the inhibitor layer IN in the recess. The fluorocarbon film, the fluorohydrocarbon film, and the hydrocarbon film are all hydrophobic films. In addition, by adjusting the processing condition of the plasma CVD, the inhibitor layer IN may be formed in an arbitrary region of the recess. In the example of FIG. 13B, the inhibitor layer IN is formed on the top of the mask MA and the bottom of the recess.

Figure 13C:
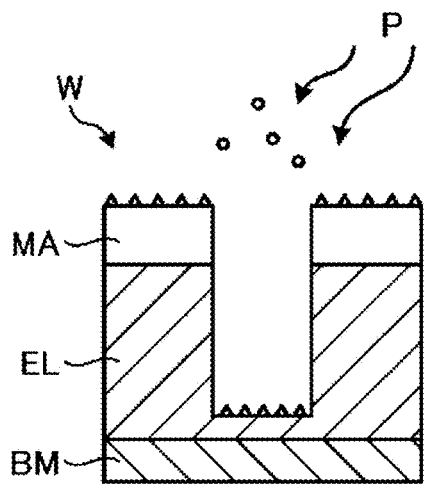
Figure 13D:
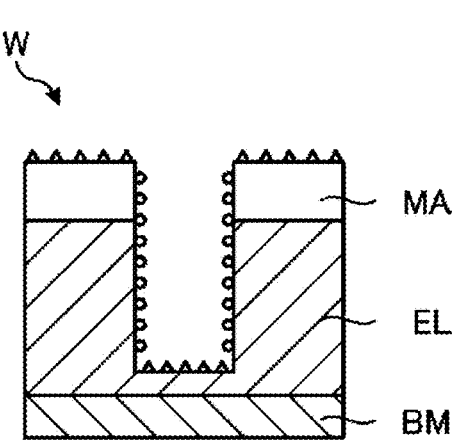

Next, in step S15, the temperature of the substrate W is adjusted to 200° C. or higher, and in step S160, the precursor P is supplied into the film forming apparatus 14, for example, as illustrated in FIG. 13C. At this time, the molecules of the precursor P are not adsorbed on the portions where the inhibitor layer IN is formed. Thus, for example, as illustrated in FIG. 13D, the molecules of the precursor P are selectively adsorbed onto the side wall of the recess where the inhibitor layer IN is not formed.

Figure 13E:
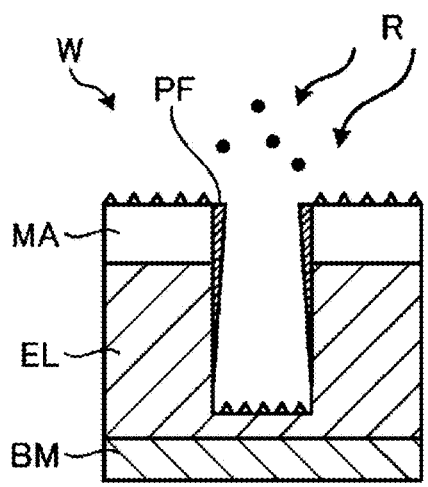

Then, in step S161, the surface of the substrate W is purged, and in step S162, the reaction gas R is supplied into the film forming apparatus 14. As a result, the molecules of the precursor P selectively adsorbed onto the side wall of the recess where the inhibitor layer IN is not formed react with the reaction gas R, so that the protective film PF is formed on the side wall of the recess as illustrated in FIG. 13E, At this time, a purging is performed in step S163 before the molecules of the reaction gas R reach the bottom of the recess, so that the protective film PF may be formed on the side wall of the recess to be thicker toward the upper portion of the side wall of the recess and thinner toward the lower portion of the side wall of the recess, for example, as illustrated in FIG. 13E.

When the protective film PF is formed by using the inhibitor I as described above, the formation position and the film thickness of the protective film PF may also be adjusted. Further, the formation position of the protective film PF may be controlled by, for example, the temperature of the substrate W or the pressure in the film forming apparatus 14. Thus, according to the present embodiment, the inhibitor I may prevent the formation of the protective film PF on the top of the mask MA, so that the clogging of the opening of the recess may also be prevented during the formation of the protective film PF.

[CD of Recess]

Figure 14A:
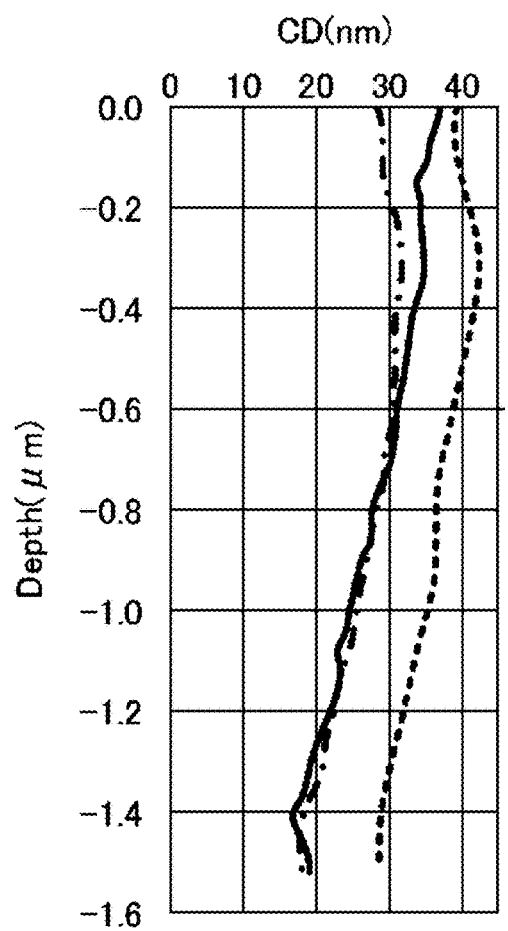
FIGS. 14A and 14B are views illustrating an example of a distribution of CD in the depth direction of a recess.
Figure 14B:
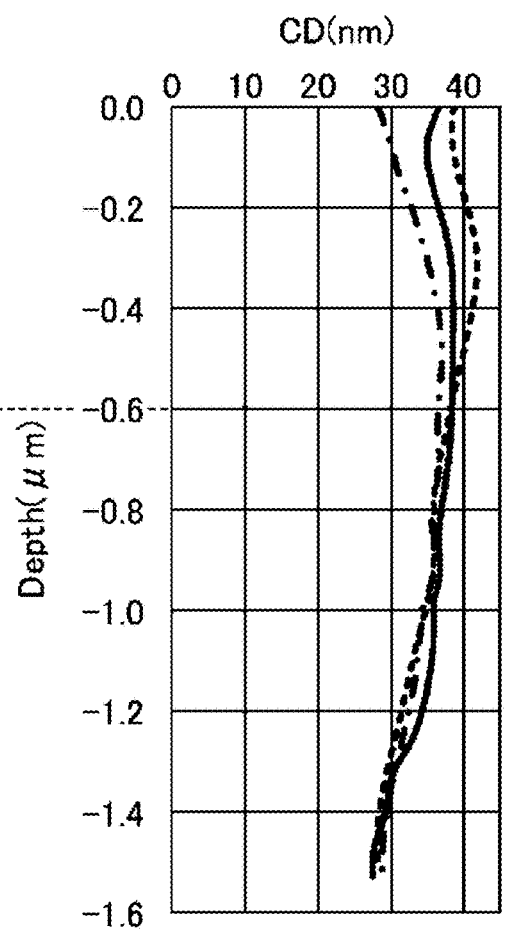

FIGS. 14A and 14B are views illustrating an example of the distribution of the CD in the depth direction of the recess. FIGS. 14A and 14B illustrate the CD distribution of each of the recess in the initial state and the recess after the protective film PF is formed, in the depth direction of the recess with reference to the interface between the mask MA and the film EL. Further, the film formation amount of the protective film PF formed on the side wall (one side) of the recess is a value obtained by dividing the difference between the CD in the initial state and the CD after the protective film PF is formed by two. In FIG. 14A, the dashed line indicates the CD distribution in the initial state of the recess (Initial State). The alternate long and short dashed line indicates the CD distribution when the protective film PF is formed on the recess in the initial state by using the substrate processing method of the first embodiment (Reference Example 1). The solid line indicates the CD distribution when the protective film PF is formed by using the normal ALD after the inhibitor layer IN is formed on the recess in the initial state by plasma CVD (Reference Example 2). Further, in FIG. 14B, the dashed line indicates the CD distribution in the initial state of the recess (Initial State). The alternate long and short dashed line indicates the CD distribution when the protective film PF is formed on the recess in the initial state by using the substrate processing method of the second embodiment (Second Embodiment). The solid line indicates the CD distribution when the protective film PF is formed on the recess in the initial state by using the substrate processing method according to the third embodiment (Third Embodiment).

As illustrated in FIG. 14A, when the protective film PF is formed by using the substrate processing method of the first embodiment, the formation of the protective film PF to the depth of about 0.6 μm below the mask MA is suppressed by using the inhibitor layer IN. However, the protective film PF is substantially conformally formed at the position deeper than about 0.6 μm. Meanwhile, as illustrated in FIG. 14B, when the protective film PF is formed by the substrate processing method of the third embodiment, the thickness of the protective film PF to the depth of about 0.6 μm below the mask MA is suppressed to about half, by using the inhibitor layer IN. Further, the formation of the protective film PF is suppressed at the position deeper than about 0.6 μm, as in a case where the inhibitor layer IN is not used. In this way, by using the inhibitor layer IN, the film thickness of the protective film PF on the upper portion of the recess may be more precisely suppressed. Further, the variation of the film thickness of the protective film PF in the depth direction of the recess may be maintained.

FIGS. 15A to 15E are views illustrating an example of the cross section of the recess after the processing is performed. In the recess in the initial state, for example, as illustrated in FIG. 15A, the opening dimension near the top of the mask MA is about 45 nm. Meanwhile, when the protective film PF is formed by using the substrate processing method of the first embodiment (Reference Example 1), the opening dimension is reduced to about 30 nm, for example, as illustrated in FIG. 15B. Meanwhile, when the protective film PF is formed by using the substrate processing method of the first embodiment through the normal ALD after the inhibitor layer IN is formed (Reference Example 2), the opening dimension is maintained at about 42 nm, for example, as illustrated in FIG. 15C. Meanwhile, when the protective film PF is formed by the substrate processing method of the second embodiment (Second Embodiment), the opening dimension is about 21 nm, for example, as illustrated in FIG. 15D. Meanwhile, when the inhibitor layer IN is formed by the substrate processing method of the third embodiment, and then, the protective film PF is formed by the substrate processing method of the second embodiment (Third Embodiment), the opening dimension is maintained at about 40 nm, for example, as illustrated in FIG. 15E. This verifies the effect of preventing the clogging of the opening of the recess by suppressing the formation of the protective film PF near the top of the mask MA using the inhibitor layer IN.

In the third embodiment, the protective film PF may be formed at an arbitrary position by adjusting the formation position of the inhibitor layer IN. Thus, the protective film PF may be formed at a desired position while adjusting the film thickness of the protective film PF in accordance with a shape abnormality of a pattern, such as bowing or necking, which is predicted to occur. Further, by assigning the A/R dependence to the formation position of the inhibitor layer IN, the position of the film formation on the side wall of the recess may be adjusted. Further, by changing the composition of the inhibitor layer IN, either the adsorption of the precursor P or the adsorption of the reaction gas R during the ALD may be inhibited. For example, when the inhibitor layer IN containing carbon is formed, the oxidation of the precursor P may be inhibited, and when the inhibitor layer IN containing CF is formed, the adsorption of the precursor P may be inhibited.

Fourth Embodiment

In the second and third embodiments described above, the protective film PF is formed by changing the coverage in the depth direction of the recess with a high A/R. Meanwhile, in the present embodiment, the protective film PF may be formed by changing the coverage in the depth direction of the recess, for not only the recess with a high A/R but also the recess with a low A/R, for example, an A/R of less than five. In the following descriptions, the "low A/R" refers to, for example, an A/R of less than five.

(Substrate Processing Method)

Figure 16:
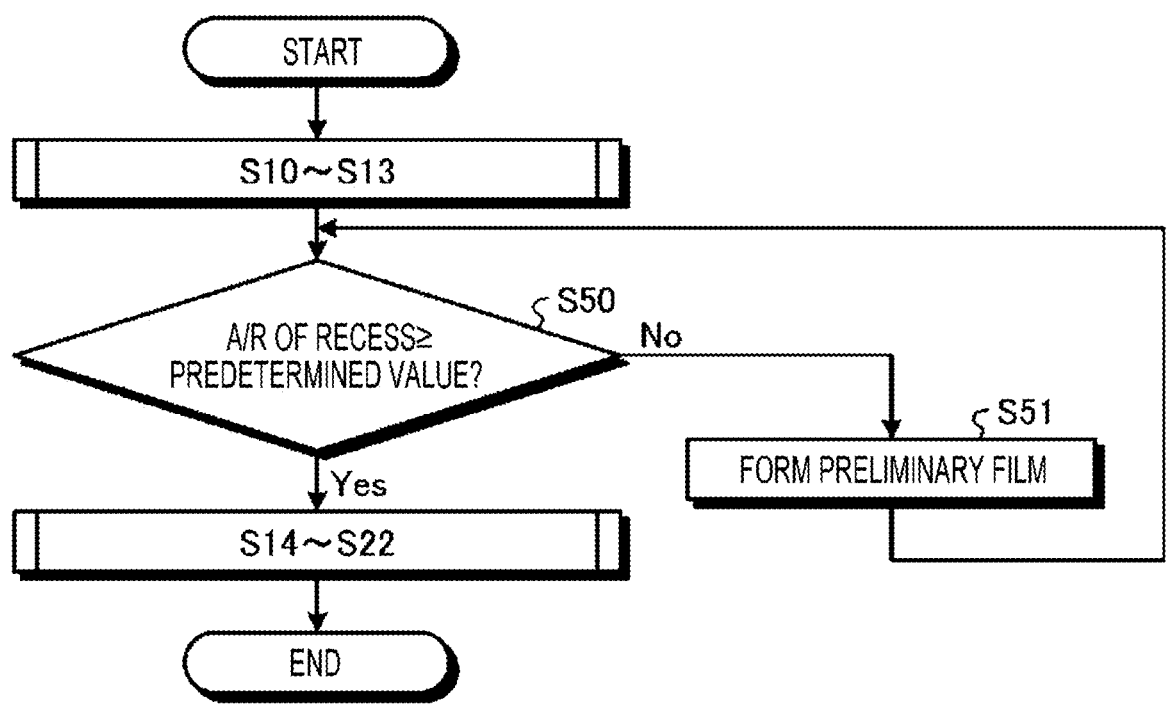
FIG. 16 is a flowchart illustrating an example of a substrate processing method according to a fourth embodiment.

FIG. 16 is a flowchart illustrating an example of a substrate processing method according to a fourth embodiment. In the present embodiment, the protective film PF is formed on the side wall of the recess by the same method as the substrate processing method illustrated in FIG. 1, except for the points described below. Further, in the present embodiment, the substrate W is processed by the substrate processing system 1 described above with reference to FIGS. 4 to 6. Further, in the present embodiment, a measuring device for measuring the A/R of the recess is provided in the storage chamber 15 of the substrate processing system 1 illustrated in FIG. 4.

Figure 17A:
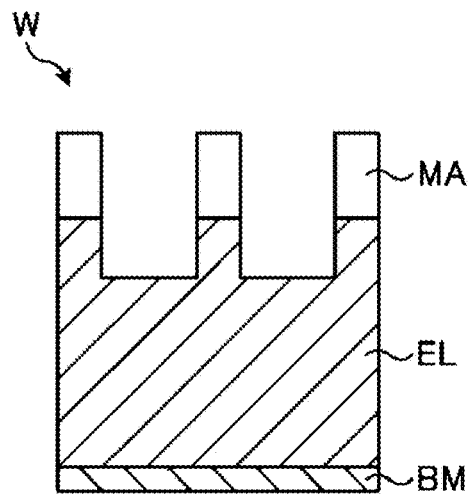
FIGS. 17A to 17E are views illustrating an example of a processing process in the substrate processing method of the fourth embodiment.

In the present embodiment, first, the processes of steps S10 to S13 illustrated in FIG. 1 are performed. As a result, a recess is formed in the film EL, for example, as illustrated in FIG. 17A. Then, the substrate W is carried into the storage chamber 15, and the A/R of the recess is measured. The method of measuring the A/R of the recess is not particularly limited, and for example, an optical method may be used.

Figure 17B:
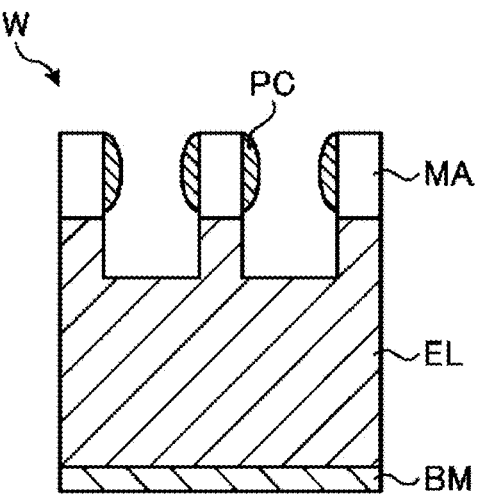

Then, the control device 100 determines whether the measured A/R of the recess is equal to or larger than a predetermined value (S50). When it is determined that the measured A/R of the recess is less than the predetermined value (S50: No), the substrate W is carried into the film forming apparatus 14. Then, for example, as illustrated in FIG. 17B, a preliminary film PC is formed on the upper portion of the recess (S51). At this time, the protective film PF is formed using the processing condition that the protective film PF is mainly formed on the upper portion of the recess, and is hardly formed on the lower portion and the bottom of the recess. Then, the substrate W is carried into the storage chamber 15 again, and the process of step S50 is performed.

Figure 17C:
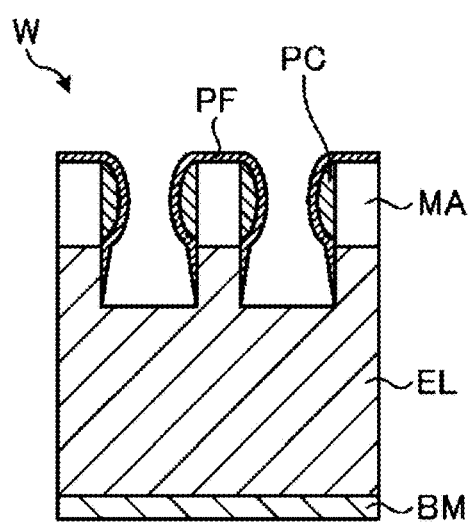
Figure 17D:
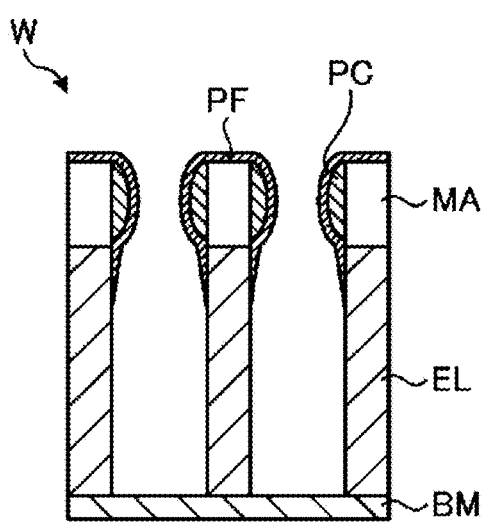
Figure 17E:
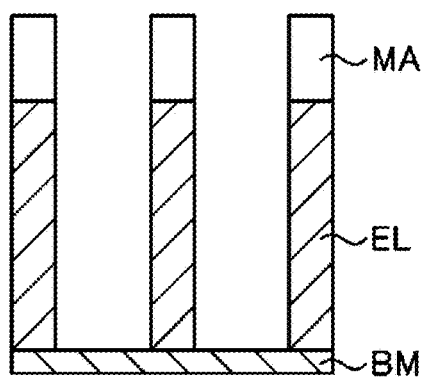

Meanwhile, when it is determined that the A/R of the recess is equal to or larger than the predetermined value (S50: Yes), the processes of steps S14 to S22 illustrated in FIG. 1 are performed. As a result of the processes of steps S14 to S17, the protective film PF is formed on the upper portion of the recess, for example, as illustrated in FIG. 17C. Then, as a result of the processes of steps S18 to S21, the bottom of the recess is further etched, for example, as illustrated in FIG. 17D. Then, the substrate W is carried out in step S22, and the protective film PF is removed by a removing device (not illustrated). As a result, for example, the cross section of the recess illustrated in FIG. 17E is obtained.

Fifth Embodiment

When the etching is performed, the depth of the recess formed in the film EL increases, and the thickness of the mask MA decreases. The protective film PF is formed near the boundary between the mask MA and the film EL where the shape abnormality may easily occur, so that the shape abnormality of the recess is suppressed. However, when the thickness of the mask MA varies as the etching progresses, the distance between the top of the mask MA and the boundary between the mask MA and the film EL varies. When the formation of the protective film PF is continued under the condition that the protective film PF is formed at the boundary between the mask MA and the film EL in accordance with the thickness of the mask MA before the start of the etching, the position where the film PF is formed deviates from the boundary between the mask MA and the film EL as the etching progresses. Thus, in the present embodiment, the processing condition for forming the protective film PF in accordance with the thickness of the mask MA is changed. As a result, the shape abnormality of the recess may be suppressed even when the etching progresses.

(Substrate Processing Method)

Figure 18:
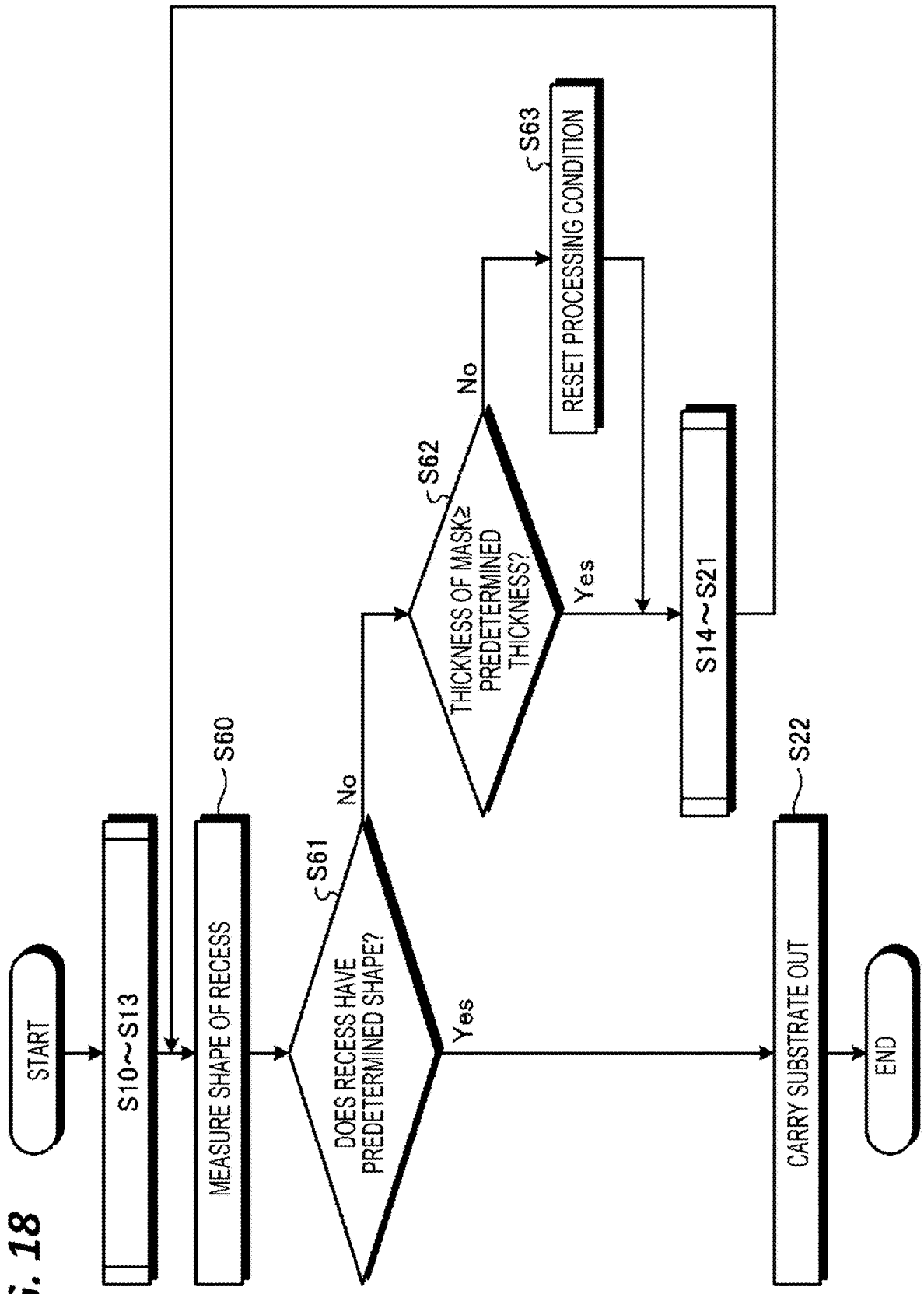
FIG. 18 is a flowchart illustrating an example of a substrate processing method according to a fifth embodiment.

FIG. 18 is a flowchart illustrating an example of a substrate processing method according to a fifth embodiment. In the present embodiment, the protective film PF is formed on the side wall of the recess by the same method as the substrate processing method illustrated in FIG. 1, except for the points described below. Further, in the present embodiment as well, the substrate W is processed by the substrate processing system 1 described above with reference to FIGS. 4 to 6. Further, in the present embodiment, a measuring device for measuring the shape of the recess is provided in the storage chamber 15 of the substrate processing system 1 illustrated in FIG. 4. The measuring device in the present embodiment is an example of a first measuring device.

In the present embodiment, first, the processes of steps S10 to S13 illustrated in FIG. 1 are performed. As a result, a recess is formed in the film EL, for example, as illustrated in FIG. 19A. Then, the substrate W is carried into the storage chamber 15, and the measuring device measures the shape of the recess (S60). The shape of the recess is, for example, the A/R of the recess.

Then, the control device 100 determines whether the measured shape of the recess is a predetermined shape (S61). The predetermined shape refers to, for example, a shape in which the A/R of the recess is equal to or larger than a predetermined value. When it is determined that the measured shape of the recess is the predetermined shape (S61: Yes), the process of step S22 is performed.

Meanwhile, when it is determined that the measured shape of the recess is not the predetermined shape (S61: No), the measuring device measures the thickness of the mask MA. Then, the control device 100 determines whether the measured thickness of the mask MA is equal to or larger than a predetermined thickness (S62). When it is determined that the measured thickness of the mask MA is equal to or larger than the predetermined thickness (S62: Yes), the processes of steps S14 to S21 are performed, and the process of step S60 is performed again.

As a result of the processes of steps S14 to S17, the protective film PF is formed on the upper portion of the recess, for example, as illustrated in FIG. 19B. Then, as a result of the processes of steps S18 to S21, the bottom of the recess is further etched, for example, as illustrated in FIG. 19C. As a result, the thickness of the mask MA is reduced, for example, as illustrated in FIG. 19D.

Meanwhile, when it is determined that the thickness of the mask MA is less than the predetermined thickness (S62: No), the control device 100 resets the processing condition for forming the protective film PF (S63). Then, the processes of steps S14 to S21 are performed based on the reset processing condition. The processing condition to be reset is, for example, a processing condition that the protective film PF is formed near the boundary between the mask MA and the film EL in accordance with the current thickness of the mask MA. As a result, even when the thickness of the mask MA decreases as the etching progresses, the protective film PF may be formed near the boundary between the mask MA and the film EL, so that the shape abnormality of the recess may be suppressed. The processing condition to be reset may be the etching condition of the recess.

In the present embodiment, the processing conditions for the processes of steps S14 to S21 are changed depending on whether the thickness of the mask MA is equal to or larger than the predetermined thickness. However, the present disclosure is not limited thereto. As for another aspect, when the processes of steps S14 to S21 are repeated "n" times or more ("n" is an integer of two or more), the condition for the n-th formation of the protective film PF may be changed from the condition for the (n−1)-th formation of the protective film PF, depending on the shape of the recess, regardless of the thickness of the mask MA. Alternatively, when the processes of steps S14 to S21 are repeated "n" times or more, the condition for the n-th formation of the protective film PF may be changed from the condition for the (n−1)-th formation of the protective film PF, regardless of the thickness of the mask MA and the shape of the recess. The film formation condition to be changed is, for example, a processing condition related to a position on the side wall of the recess where the protective film PF is to be formed, or the film thickness of the protective film PF to be formed on the side wall of the recess. Further, the etching condition of the recesses may be changed.

Sixth Embodiment

In the second embodiment, at least one of the precursor P and the reaction gas R is supplied only to a predetermined portion of the side wall of the recess, so that the reaction between the precursor P and the reaction gas R occurs only at the predetermined portion of the side wall of the recess. Meanwhile, in the present embodiment, by controlling the temperature of the substrate W, the range in which the protective film PF is formed in the depth direction of the recess is controlled.

(Substrate Processing Method)

Figure 20:
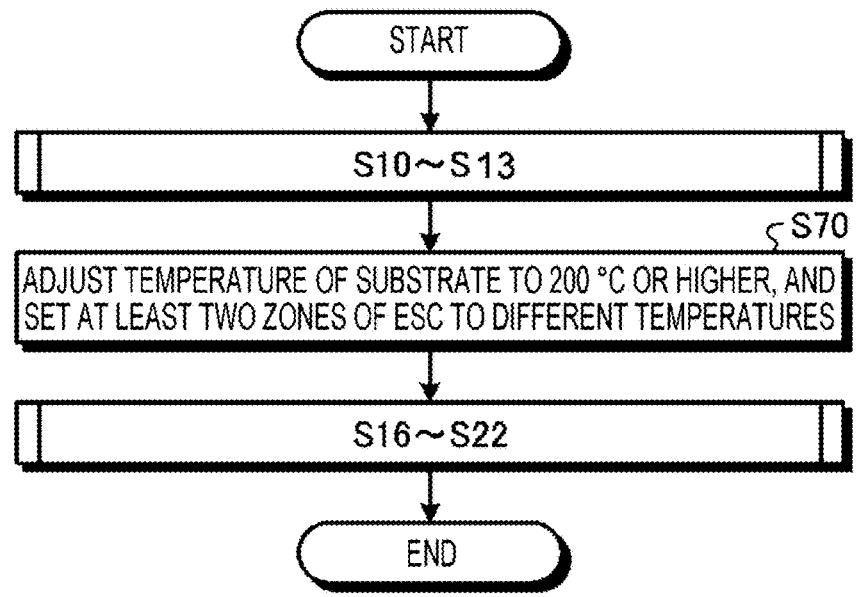
FIG. 20 is a flowchart illustrating an example of a substrate processing method according to a sixth embodiment.

FIG. 20 is a flowchart illustrating an example of the substrate processing method according to the sixth embodiment. In the present embodiment, the protective film PF is formed on the side wall of the recess by the same method as the substrate processing method illustrated in FIG. 1, except for the points described below. Further, in the present embodiment, the substrate W is processed by the substrate processing system 1 described above with reference to FIG. 4, and the formation of the protective film PF is performed in each etching apparatus 12. Further, in the present embodiment, the electrostatic chuck ESC is divided into a plurality of zones, and the heater HT individually controls the temperature of each zone.

In the present embodiment, first, the processes of steps S10 to S13 illustrated in FIG. 1 are performed. Then, in the etching apparatus 12, the temperature of the substrate W is adjusted to 200° C. or higher, and at least two zones of the electrostatic chuck ESC are set to different temperatures (S70). Then, the processes of steps S16 to S22 are performed. Further, in the present embodiment, the processes of S16 and S17 are performed in each etching apparatus 12, and the process of step S18 is not performed.

Figure 21:
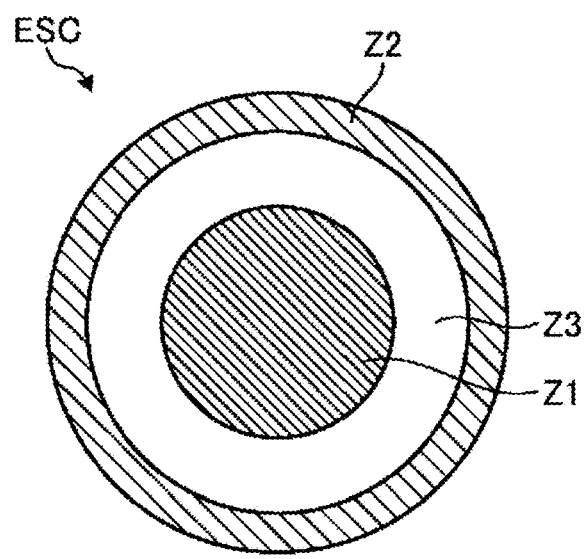
FIG. 21 is a view illustrating an example of zones of an ESC.
Figure 22:
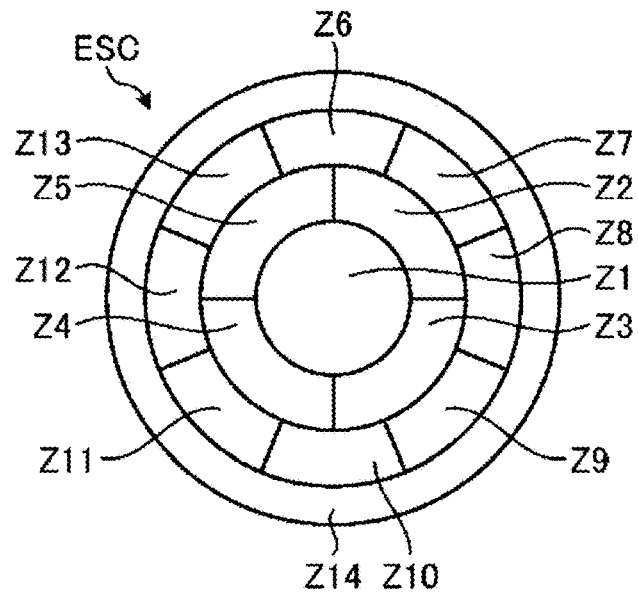
FIG. 22 is a view illustrating another example of the zones of the ESC.
Figure 23:
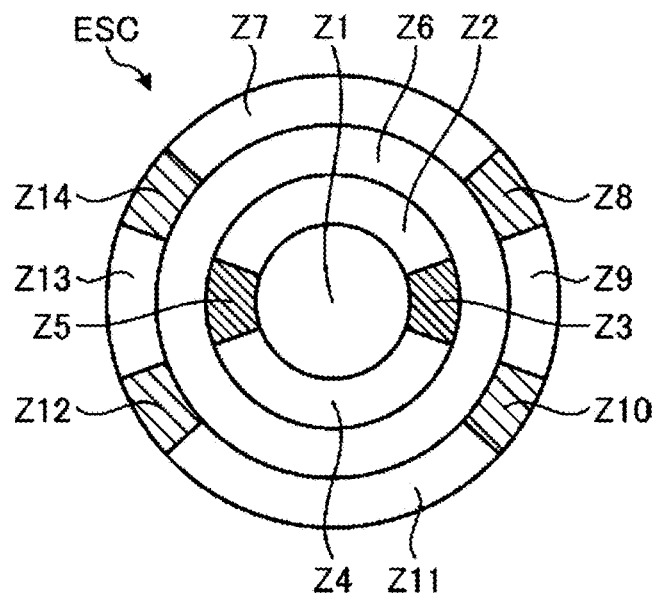
FIG. 23 is a view illustrating another example of the zones of the ESC.

In the present embodiment, the electrostatic chuck ESC of the etching apparatus 12 is divided into a plurality of concentric zones Z1 to Z3, for example, as illustrated in FIG. 21. The temperature of each of the zones Z1 to Z3 is individually controlled by the heater HT. The method of dividing the ESC into the plurality of zones of which temperatures are individually controllable is not limited to FIG. 21. As another example, the electrostatic chuck ESC of the etching apparatus 12 may be divided into 14 zones Z1 to Z14, for example, as illustrated in FIGS. 22 and 23.

(Relationship between Temperature and Film Formation Position of Protective Film PF)

Figure 24:
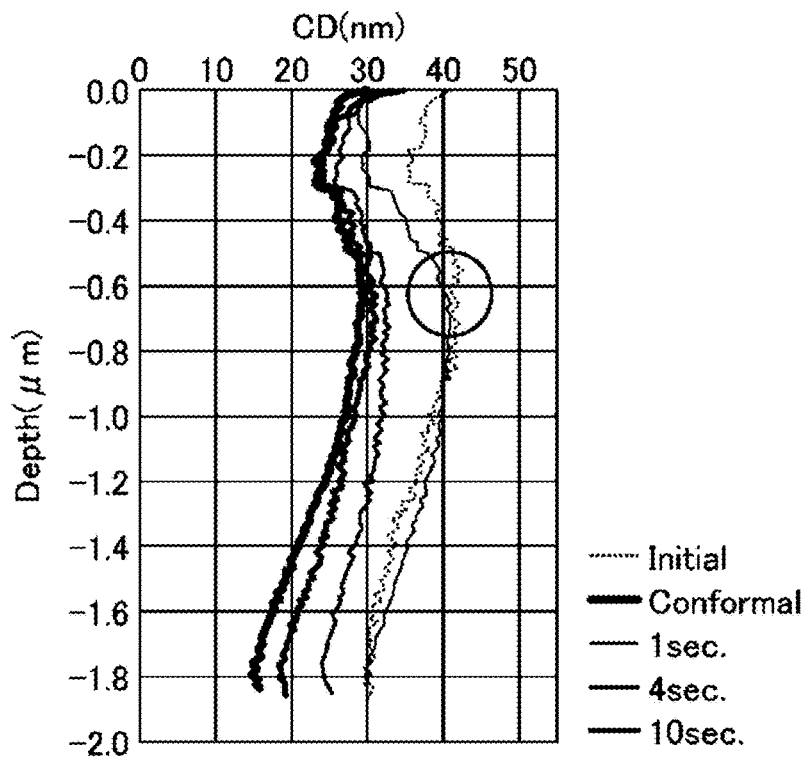
FIG. 24 is a view illustrating an example of a distribution of a CD in the depth direction of a recess under a first temperature condition.
Figure 25:
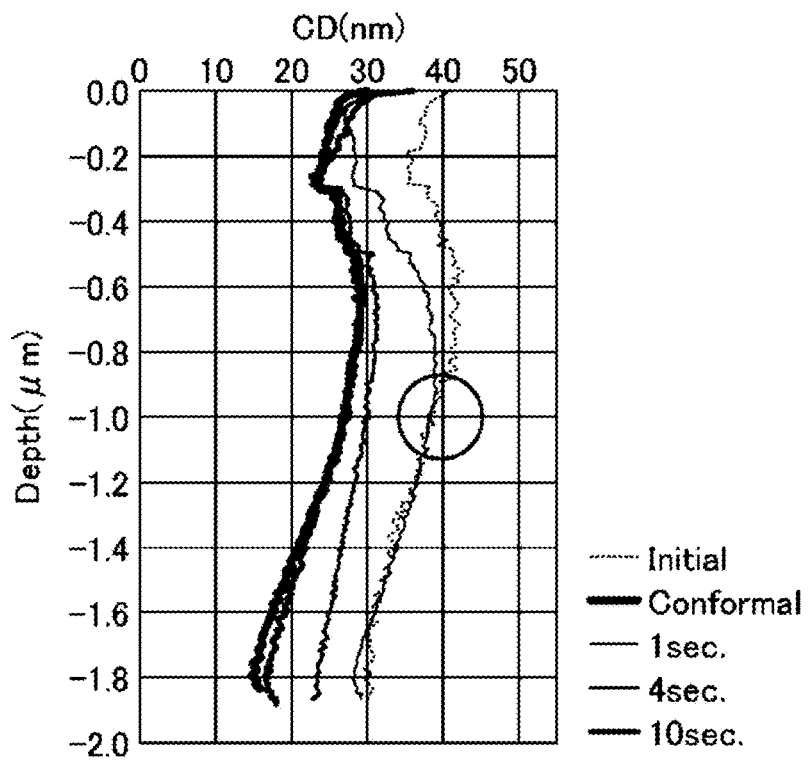
FIG. 25 is a view illustrating an example of a distribution of a CD in the depth direction of a recess under a second temperature condition.

FIG. 24 is a view illustrating an example of the distribution of the CD in the depth direction of the recess under a first temperature condition. FIG. 25 is a view illustrating an example of the distribution of the CD in the depth direction of the recess under a second temperature condition. In the experimental results illustrated in FIGS. 24 and 25, a process that includes four steps of introducing the precursor P, purging, introducing the reaction gas R, and purging is performed 35 times. When the reaction gas R is introduced, the reaction gas R is converted into plasma. A silicon-containing gas is used as the precursor P, and an oxygen gas diluted with argon is used as the reaction gas. Thus, the protective film PF formed in FIGS. 24 and 25 is a silicon oxide film. It is believed that the film formation characteristic of the silicon oxide film with respect to the temperature is the same as the film formation characteristic of a silicon nitride film with respect to the temperature. Thus, in the following, descriptions will be made on a case where the protective film PF is the silicon oxide film, as an example.

In the experiments, the temperature of the electrostatic chuck ESC when the reaction gas R is introduced is set to two types, and the thickness and the position of the formed protective film PF are measured. In the experiments of FIG. 24, the temperature of the electrostatic chuck ESC is adjusted to 10° C., and in the experiments of FIG. 25, the temperature of the electrostatic chuck ESC is adjusted to 60° C. Further, the introduction time of the reaction gas R (plasma generation time) is set to four types of 1 second, 4 seconds, 10 seconds, and a saturation completion time (sufficient time enough for the reaction gas R to be completely saturated on the surface of the substrate W).

In FIGS. 24 and 25, the "Initial" represents the CD of the recess before the start of the experiment, and the "Conformal" represents the CD of the recess when the processing is performed until the saturation completion time ends. As seen from FIGS. 24 and 25, in the "Conformal," the protective film PF is formed on the side wall of the recess with a substantially uniform thickness, regardless of the depth of the recess.

Next, the introduction time of the reaction gas R is changed, and the thickness of the protective film PF formed in the recess is measured. As seen from the graph of FIG. 24, the state of the protective film PF formed when the introduction time of the reaction gas R is set to 10 seconds slightly decreases toward the lower portion of the recess, but has the substantially conformal film thickness. Further, when the introduction time of the reaction gas R is set to 4 seconds, a difference occurs in the thickness of the protective film PF that is being formed as compared with the case of 10 seconds, and the protective film PF is formed to be thinner on the lower portion of the side wall of the recess than that in the case of 10 seconds. When the introduction time of the reaction gas R is set to 1 second, the protective film PF is formed with the thickness gradually decreasing in the depth direction of the recess, from the boundary between the mask MA and the film EL to the position of about 0.6 μm in the depth direction of the recess. However, the protective film PF is hardly formed on the portion below 0.6 μm.

Meanwhile, as seen from the graph of FIG. 25 in which the temperature of the electrostatic chuck ESC is adjusted to 60° C., the state of the protective film PF formed when the introduction time of the reaction gas R is set to 10 seconds slightly decreases downward, but is substantially conformal. When the introduction time of the reaction gas R is set to 4 seconds, a difference occurs in the thickness of the protective film PF that is being formed as compared with the case of 10 seconds, and the protective film PF is formed to be thinner on the lower portion of the side wall of the recess than that in the case of 10 seconds. When the introduction time of the reaction gas R is set to 1 second, the protective film PF is formed with the thickness gradually decreasing in the depth direction of the recess, from the boundary between the mask MA and the film EL to the position of about 1 μm in the depth direction of the recess. However, the protective film PF is hardly formed on the portion below 1 μm.

In any case, when the introduction time of the reaction gas R is reduced, the protective film PF is formed with the thickness gradually decreasing in the depth direction of the recess. In particular, in a case where the introduction time of the reaction gas R is set to 1 second, when the temperature of the electrostatic chuck ESC is controlled to 10° C., the formation of the protective film PF at the position below 0.6 μm may be suppressed, and when the temperature of the electrostatic chuck ESC is controlled to 60° C., the formation of the protective film PF at the position below 1 μm may be suppressed. From the experimental results illustrated in FIGS. 24 and 25, it may be seen that the thickness of the protective film PF to be formed and the distribution of the protective film PF may be adjusted by changing the temperature of the electrostatic chuck ESC.

Figure 26:
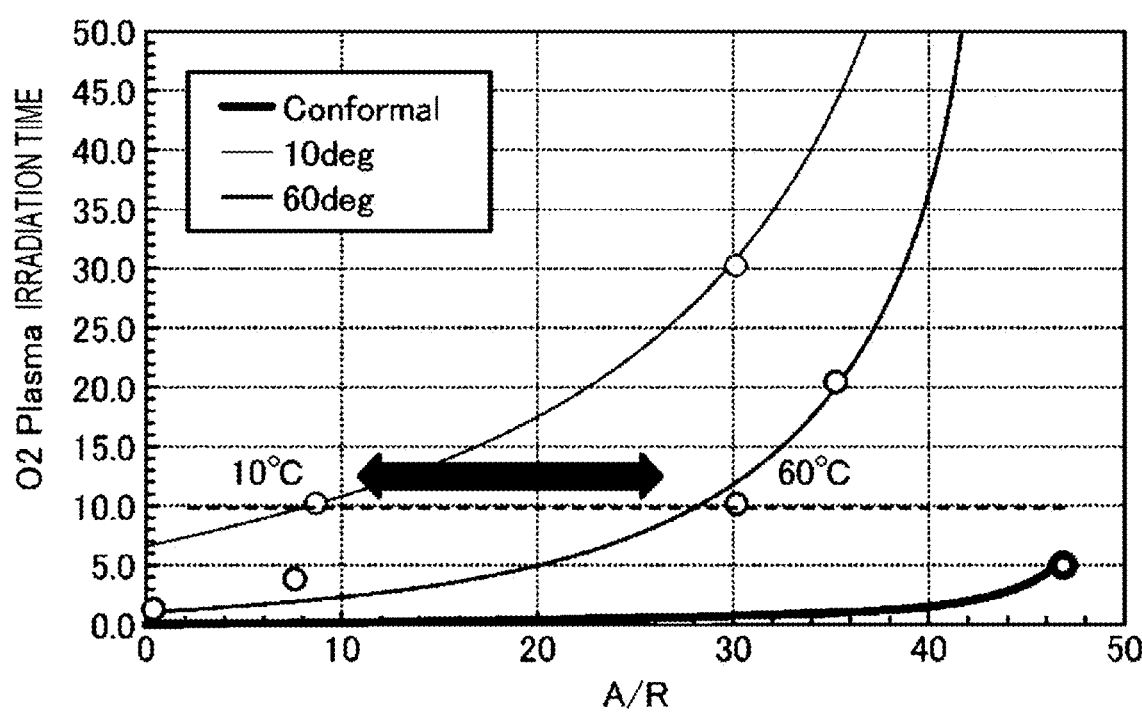
FIG. 26 is a view collectively illustrating results of FIGS. 24 and 25.

FIG. 26 is a view summarizing the experimental results of FIGS. 24 and 25. Specifically, FIG. 26 is obtained by superimposing the experimental results on a graph representing the correspondence between the saturation time of oxygen ($O_2$) plasma calculated by using, for example, the diffusion equation, and the A/R.

As illustrated in FIG. 26, the lower limit position (A/R) at which the film is formed varies in response to the change in the introduction time of the reaction gas R (here, irradiation time of $O_2$ plasma). Further, a difference of about 20 in the A/R of the lower limit position where the protective film PF is formed occurs between the case where the temperature of the electrostatic chuck ESC is set to 10° C. and the case where the temperature of the ESC is set to 60° C. (the portion indicated by an arrow in FIG. 26). From this point, the lower limit position where the protective film PF is formed may be changed in the range of about 20 A/R, by changing the temperature of the electrostatic chuck ESC in the range of, for example, 10° C. to 60° C.

Thus, in the present embodiment, the position on the side wall of the recess where the shape abnormality such as bowing or tapering occurs is observed in advance, and thereafter, the protective film PF is formed in the region of the side wall where the shape abnormality is likely to occur. Further, in the present embodiment, by adjusting the temperature of the electrostatic chuck ESC on which the substrate W is placed, the region where the protective film PF is to be formed on the side wall of the recess is adjusted. Further, in the present embodiment, by forming the protective film PF with the film thickness gradually decreasing in the depth direction of the recess, the protective film PF may be formed in the region (position) corresponding to the shape abnormality of the recess such as a tapered shape or bowing.

Seventh Embodiment

In the present embodiment, after the processes of steps S10 to S21 of FIG. 1 are performed, the substrate W is carried into the storage chamber 15. The measuring device provided in the storage chamber 15 measures the state of the protective film PF formed in the recess. The measuring device provided in the storage chamber 15 is an example of a second measuring device. The state of the protective film PF to be measured is, for example, the film thickness of the protective film PF or the position on the side wall of the recess where the protective film PF remains. Then, the control device 100 determines whether the state of the protective film PF is brought into a predetermined state according to the measured state of the protective film PF.

When it is determined that the state of the protective film PF is brought into the predetermined state, the processes of steps S14 to S21 are continuously performed one or more times until the recess having a predetermined shape is formed. Meanwhile, when it is determined that the state of the protective film PF is not brought into the predetermined state, the control device 100 adjusts at least a portion of the processing conditions for the processes of steps S14 to S21 such that the state of the protective film PF is brought into the predetermined state, based on the measured state of the protective film PF. Then, the processes of steps S14 to S21 are performed once or more times.

[Miscellaneous]

The present disclosure is not limited to the embodiments described above, and may be variously modified within the scope of the technical gist thereof.

Figure 27C:
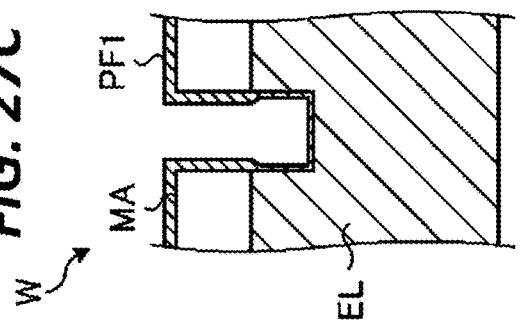
FIGS. 27A to 27F are views illustrating an example of a processing process in a substrate processing method of a seventh embodiment.
Figure 27B:
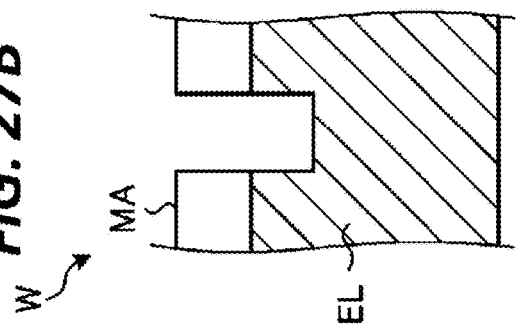
Figure 27A:
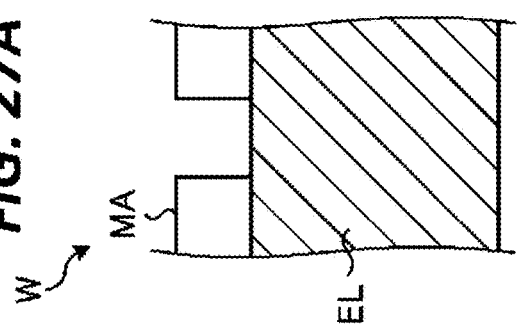
Figure 27F:
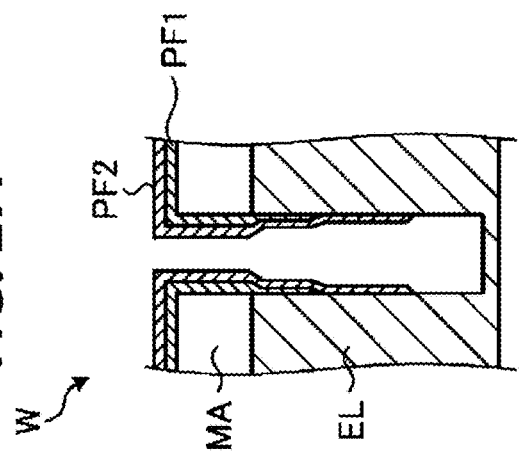
Figure 27E:
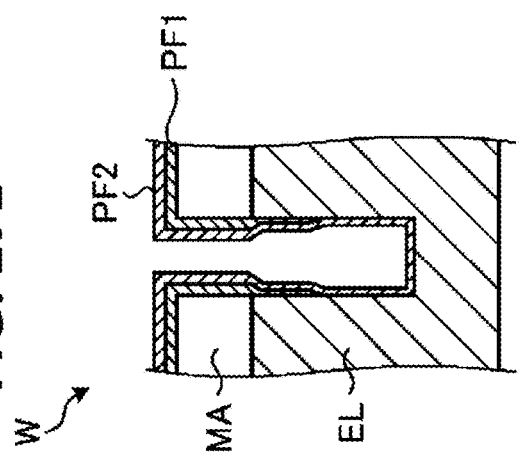
Figure 27D:
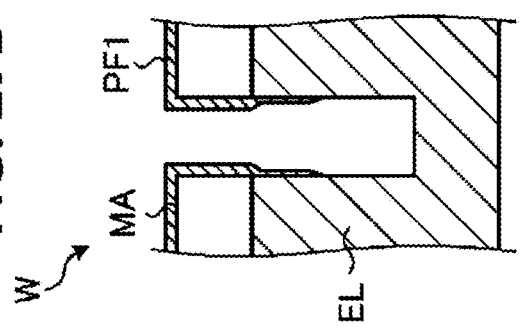

For example, in each of the embodiments described above, the formation of the protective film PF which is a silicon nitride film on the side wall of the recess and the further etching of the recess are repeated. However, the present disclosure is not limited thereto. For example, the substrate W illustrated in FIG. 27A may be etched to form the recess illustrated in FIG. 27B, and a protective film PF1 which is a silicon nitride film may be formed on the side wall of the recess as illustrated in FIG. 27C. Then, the recess may be further etched as illustrated in FIG. 27D, and then, a protective film PF2 which is, for example, a silicon oxide film may be formed on the side wall of the recess as illustrated in FIG. 27E. Then, the recess may be further etched as illustrated in FIG. 27F. In this way, the protective film PF2 which is a silicon oxide film may be formed at least once as the protective film PF, while the formation of the protective film PF and the etching of the recess are repeated. The protective film PF2 is an example of a third film. The silicon oxide film may be formed under a condition of a temperature lower than that for the silicon nitride film. Thus, the protective film PF1 may be formed under a temperature condition close to the temperature condition in which the etching is performed. As a result, the protective film PF1 may be formed in the etching apparatus 12. Accordingly, the time for transferring the substrate W between the etching apparatus 12 and the film forming apparatus 14 may be reduced, so that the throughput may be improved.

According to various aspects and embodiments of the present disclosure, the shape abnormality of a semiconductor pattern may be suppressed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
    (a) carrying a substrate into a first chamber, the substrate having a first film, which is a processing target, with a recess formed therein, and a mask provided on the first film with an opening formed at a position of the mask corresponding to the recess;
    (b) adjusting a temperature of the substrate to 200° C. or higher;
    (c) forming a second film, which is a silicon nitride film, on a side wall of the recess;
    (d) carrying the substrate into a second chamber different from the first chamber;
    (e) adjusting the temperature of the substrate to 100° C. or lower; and
    (f) etching a bottom of the recess,
    wherein (c) includes
        (c-1) supplying silicon-containing reactive species into the first chamber, thereby adsorbing the silicon-containing reactive species onto the side wall of the recess; and
        (c-2) supplying nitrogen-containing reactive species into the first chamber to cause a reaction between the silicon-containing reactive species adsorbed onto the side wall of the recess and the nitrogen-containing reactive species, thereby forming the second film on the side wall of the recess,
    a film thickness of the second film is 20 nm or less, and
    (a) to (f) are repeated twice or more in this order until an aspect ratio becomes 50 or more, the aspect ratio indicating a ratio of a depth dimension from the opening of the mask to the bottom of the recess, to a dimension of the opening of the mask.

2. The substrate processing method according to claim 1, further comprising:
    before (a), etching the first film via the mask to form the recess,
    wherein before the etching the first film is performed, a thickness of the mask is 2,000 nm or more, and
    an aspect ratio of the mask is 20 or more.

3. The substrate processing method according to claim 1, wherein in the substrate carried into the first chamber in (a), the ratio of the depth dimension from the opening of the mask to the bottom of the recess, to the dimension of the opening of the mask is 10 or more.

4. The substrate processing method according to claim 1, wherein after (a) to (f) are repeated twice or more until the aspect ratio becomes 50 or more, the ratio of the depth dimension from the opening of the mask to the bottom of the recess, to the dimension of the opening of the mask is 10 or less.

5. The substrate processing method according to claim 1, wherein the nitrogen-containing reactive species are produced by converting a nitrogen-containing gas into plasma.

6. The substrate processing method according to claim 1, wherein (c) further includes (c-0) converting a gas containing nitrogen and hydrogen into plasma in the first chamber, to terminate a surface of the substrate with an amino group, and
    (c-0) is performed before (c-1).

7. The substrate processing method according to claim 1, wherein in (c), the second film of 10 nm or less is formed on the side wall of the recess.

8. The substrate processing method according to claim 1, wherein in the substrate, a mask film is provided on the first film,
    in (c), the second film is also formed on a surface of the mask film, and
    the film thickness of the second film formed on a side wall of the mask film is larger than the film thickness of the second film formed on the surface of the recess.

9. The substrate processing method according to claim 1, wherein in (c-2), a bias voltage is applied to a stage on which the substrate is placed.

10. The substrate processing method according to claim 1, wherein the first film includes a silicon oxide film and a silicon nitride film, and
    a content ratio of silicon atoms and nitrogen atoms in the silicon nitride film of the first film is different from that in the second film.

11. The substrate processing method according to claim 1, wherein the first film includes a silicon oxide film and a silicon nitride film, and a film density in the silicon nitride film of the first film is different from that in the second film.

12. The substrate processing method according to claim 1, wherein the first film includes a silicon oxide film and a silicon nitride film, and a crystal structure in the silicon nitride film of the first film is different from that in the second film.

13. The substrate processing method according to claim 1, wherein as the aspect ratio increases, at least one of a time for supplying the silicon-containing reactive species and a time for supplying the nitrogen-containing reactive species is increased.

14. The substrate processing method according to claim 1, wherein the substrate processing method is performed by using a batch type film forming apparatus capable of accommodating a plurality of substrates, and a substrate processing system provided with a plurality of single-wafer type etching apparatuses, and wherein the first chamber corresponds to the film forming apparatus, and the second chamber corresponds to each of the etching apparatuses.

15. The substrate processing method according to claim 1, further comprising:

(g) forming a third film, which is a silicon oxide film, on the side wall of the recess formed in (f), wherein (g) is performed after (f), and after (g) is performed, (f) is additionally performed.

16. The substrate processing method according to claim 1, wherein a ratio of the film thickness of the second film on the bottom of the recess to the film thickness of the second film on an upper side wall of the recess is 0.7 or more.

* * * * *